US008866242B2

(12) United States Patent
Li et al.

(10) Patent No.: US 8,866,242 B2
(45) Date of Patent: Oct. 21, 2014

(54) MTJ STRUCTURE AND INTEGRATION SCHEME

(75) Inventors: Xia Li, San Diego, CA (US); Seung H. Kang, San Diego, CA (US); Matthew M. Nowak, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/293,310

(22) Filed: Nov. 10, 2011

(65) Prior Publication Data

US 2013/0119494 A1    May 16, 2013

(51) Int. Cl.

| H01L 29/82 | (2006.01) |
| H01L 27/22 | (2006.01) |
| H01L 21/02 | (2006.01) |
| G11C 11/00 | (2006.01) |
| G11C 11/14 | (2006.01) |
| G11C 11/15 | (2006.01) |
| H01L 43/12 | (2006.01) |
| H01L 43/08 | (2006.01) |
| H01L 21/00 | (2006.01) |

(52) U.S. Cl.
CPC .............. *H01L 43/08* (2013.01); *H01L 27/222* (2013.01); *H01L 43/12* (2013.01)
USPC ........... 257/421; 257/422; 257/427; 257/295; 257/E21.665; 257/E29.323; 365/158; 365/171; 365/173; 438/3

(58) Field of Classification Search
USPC .................... 257/295, 414, 421–422, 427, 20, 257/E21.001, E29.323, E21.665, E43.006; 365/158, 171, 173; 438/3; 360/322
See application file for complete search history.

(56) References Cited

U.S. PATENT DOCUMENTS

| 6,921,953 | B2 * | 7/2005 | Deak .............................. 257/421 |
| 7,054,117 | B2 * | 5/2006 | Ho et al. ................... 360/324.12 |
| 7,306,954 | B2 * | 12/2007 | Nejad et al. ....................... 438/3 |
| 7,579,197 | B1 | 8/2009 | Li |
| 2002/0105035 | A1 * | 8/2002 | Sandhu et al. ................ 257/375 |
| 2002/0167767 | A1 * | 11/2002 | Jayasekara ................. 360/324.2 |
| 2005/0048674 | A1 * | 3/2005 | Shi et al. ........................... 438/3 |
| 2006/0234445 | A1 * | 10/2006 | Yang ............................. 438/257 |
| 2008/0117552 | A1 | 5/2008 | Zhou et al. |
| 2008/0278867 | A1 * | 11/2008 | Fukumoto et al. ....... 360/324.12 |
| 2009/0261433 | A1 | 10/2009 | Kang et al. |
| 2009/0261434 | A1 | 10/2009 | Kang et al. |
| 2010/0032779 | A1 | 2/2010 | Tsukamoto et al. |
| 2011/0008915 | A1 * | 1/2011 | Nozieres et al. ................... 438/3 |
| 2011/0014500 | A1 | 1/2011 | Horng et al. |
| 2011/0037108 | A1 | 2/2011 | Sugiura et al. |
| 2011/0049656 | A1 | 3/2011 | Li et al. |

OTHER PUBLICATIONS

International Search Report and Written Opinion—PCT/US2012/064715—ISA/EPO—Feb. 26, 2013.

* cited by examiner

*Primary Examiner* — Mary Wilczewski
*Assistant Examiner* — Erik T Peterson
(74) *Attorney, Agent, or Firm* — Sam Talpalatsky; Nicholas J. Pauley; Joseph Agusta

(57) ABSTRACT

A memory device may comprise a magnetic tunnel junction (MTJ) stack, a bottom electrode (BE) layer, and a contact layer. The MTJ stack may include a free layer, a barrier, and a pinned layer. The BE layer may be coupled to the MTJ stack, and encapsulated in a planarized layer. The BE layer may also have a substantial common axis with the MTJ stack. The contact layer may be embedded in the BE layer, and form an interface between the BE layer and the MTJ stack.

12 Claims, 27 Drawing Sheets

MTJ STRUCTURE AND INTEGRATION SCHEME

FIELD OF DISCLOSURE

This disclosure relates to magnetic tunnel junction (MTJ) devices and methods of integration and fabrication thereof.

BACKGROUND

MTJ elements can be used to create magnetoresistive random access memory (MRAM). Each memory cell (e.g., MRAM) includes an MTJ unit whose resistance can be adjusted to represent a logic state "0" or "1." Unlike conventional RAM data that is stored by electric charge or current flow, MRAM data is stored by magnetic storage elements. The elements may be formed from two ferromagnetic plates, each of which can hold a magnetic moment, separated by a thin insulating layer, which together form an MTJ. One of the two plates is pinned by an anti-ferromagnetic layer (hereinafter "fixed layer") set to a particular polarity; the polarization of the other plate (hereinafter "free layer") will change magnetic moment orientation by a certain direction current or to match that of a sufficiently strong external field.

Reading the polarization state of an MRAM cell is accomplished by measuring the electrical resistance of the cell's MTJ. A particular cell may be conventionally selected by powering an associated transistor, which switches current from a bit line through the MTJ to a source line or verse vice. Due to the tunneling magnetoresistance effect, the electrical resistance of the cell changes due to the relative moment orientation of the polarizations in the two magnetic layers of the MTJ. By measuring the resulting current, the resistance inside any particular cell can be determined, and, from this, the polarity of the free layer can be determined. If the two layers have the same polarization, this is typically considered to mean State "0," and the resistance is "low," while if the two layers are of opposite polarization the resistance will be higher and this is typically considered to mean State "1."

Data may be written to the cells using a variety of schemes. In conventional MRAM, an external magnetic field is provided by current in a wire in proximity to the cell, which is strong enough to align the free layer.

Alternatively, spin-transfer-torque (STT) MRAM uses spin-aligned or polarized electrons to directly torque and flip the magnetic moment of the free layer. The current to write to an STT-MRAM cell is less than the write current for conventional MRAM. Furthermore, no external magnetic field is required, so that adjacent cells are substantially unaffected by stray fields. Thus, write current further decreases as the memory cell size scales down.

One drawback of the MRAM cell structure is that undesired short circuits can occur when forming a contact on the top electrode. As integrated circuits continue to scale down, this increases the susceptibility of the MRAM cell structure to short circuits. Such short circuits may cause the MRAM cell structures to fail. Conventional techniques of increasing the MTJ top cap layer thickness or sandwiching the top structure are aimed at alleviating this issue, but are limited by logic technology. Other drawbacks are associated with conventional MRAM cell structures as well. For example, MTJ patterning and sidewall damage may pose an increasing challenge as MTJ size continues to scale down. Thus, what is needed is an improved MRAM cell structure that reduces or avoids one or more of these drawbacks.

SUMMARY

Exemplary embodiments of the invention are accordingly directed to MTJ devices and methods for MTJ fabricating the same. In one aspect, the MTJ fabrication process may be modified to reduce bottom electrode (BE) contact resistance to improve MTJ gap filling performance. In another aspect, the MTJ fabrication process may be modified with an anti-ferromagnetic (AFM) and BE layer reverse etch using chemical mechanical polishing (CMP) to reduce surface roughness. In another aspect, the MTJ fabrication may use a partial MTJ etch to reduce etch time, improve MTJ size/shape control, and reduce sidewall damage.

In one embodiment, an MTJ structure for a memory device is disclosed. The memory device may comprise: an MTJ stack including a free layer, a barrier layer, and a pinned layer; a BE layer coupled to the MTJ stack, encapsulated in a planarized layer, and having a substantially common axis with the MTJ stack; and a contact layer embedded in the BE layer, the contact layer forming an interface between the BE layer and the MTJ stack.

Another embodiment may include a method for fabricating a memory device, the method comprising: depositing an MTJ stack including a free layer, a barrier layer, and a pinned layer; depositing a BE layer coupled to the MTJ stack, encapsulated in a planarized layer, and having a substantially common axis with the MTJ stack; and depositing a contact layer embedded in the BE layer, the contact layer forming an interface between the BE layer and the MTJ stack.

Another embodiment may include a memory device comprising: an MTJ stack including a free layer, a barrier layer, and a pinned layer; a BE layer coupled to the MTJ stack, encapsulated in a planarized layer, and having a substantially common axis with the MTJ stack; and contact means for coupling the BE layer to the MTJ stack, the contact means being embedded in the BE layer to form an interface between the BE layer and the MTJ stack.

Another embodiment may include a method for fabricating a memory device, the method comprising: step for depositing an MTJ stack including a free layer, a barrier layer, and a pinned layer; step for depositing a BE layer coupled to the MTJ stack, encapsulated in a planarized layer, and having a substantially common axis with the MTJ stack; and step for depositing a contact layer embedded in the BE layer, the contact layer forming an interface between the BE layer and the MTJ stack.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation. The word "deposit" is used herein to also mean dispose, when referring to depositing a layer in the fabrication process.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequence of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 1:
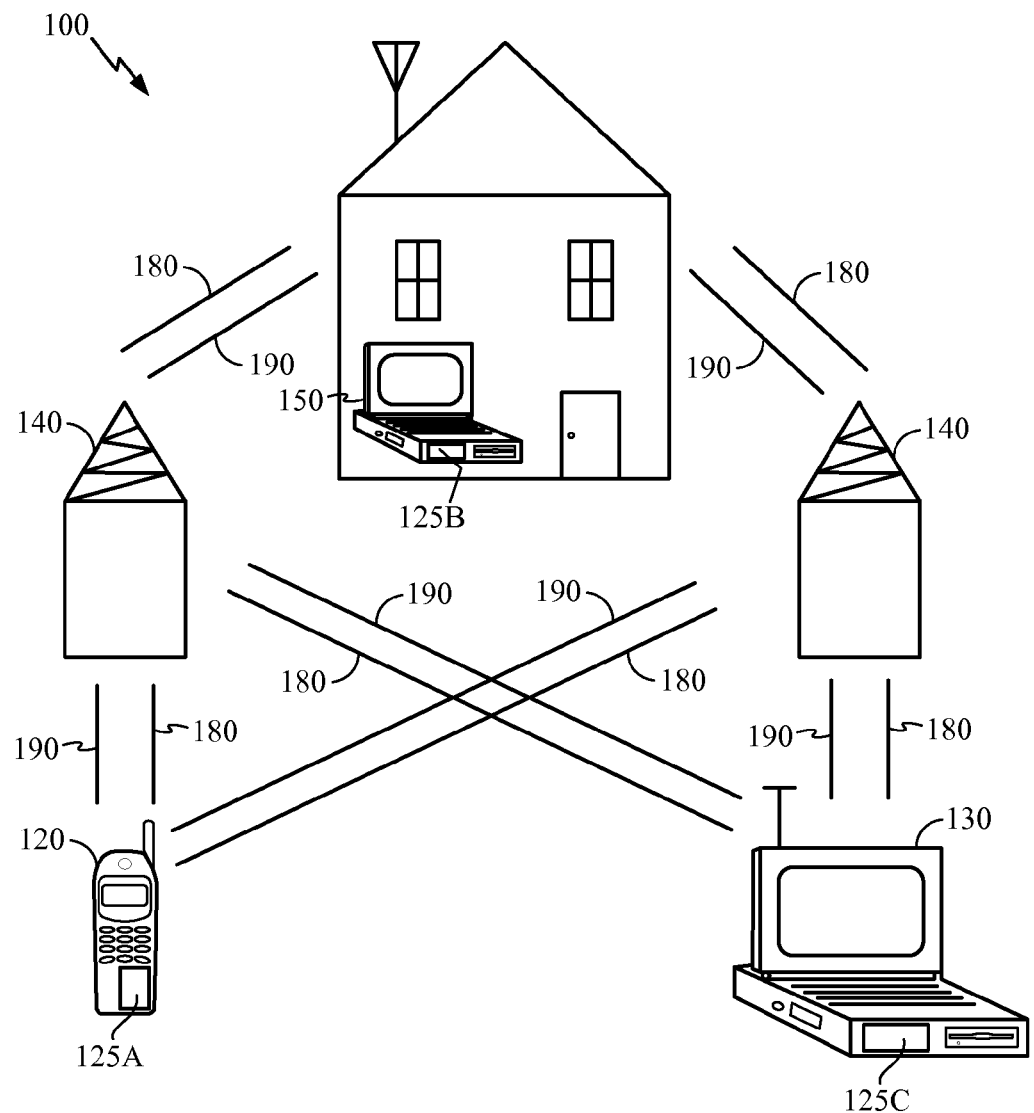
FIG. 1 shows an exemplary wireless communication system in which embodiments of the disclosure may be employed.

FIG. 1 shows an exemplary wireless communication system 100 in which embodiments of the disclosure may be employed. For purposes of illustration, FIG. 1 shows three remote units 120, 130, and 150 and two base stations 140. It will be appreciated that conventional wireless communication systems may have many more remote units and base stations. FIG. 1 shows forward link signals 180 from the base stations 140 and the remote units 120, 130, and 150, and reverse link signals 190 from the remote units 120, 130, and 150 to base stations 140.

In FIG. 1, remote unit 120 is shown as a mobile telephone, remote unit 130 is shown as a portable computer, and remote unit 150 is shown as a fixed location remote unit in a wireless local loop system. For example, the remote units may be mobile phones, hand-held personal communication systems (PCS) units, portable data units such as personal data assistants, navigation devices (e.g., GPS enabled devices), set-top boxes, music players, video players, entertainment units, fixed location data units such as meter reading equipment, or any other device that stores or retrieves data or computer instructions, or any combination thereof Regardless of device type, the remote units 120, 130, and 150 may include MRAM and/or STT MRAM memory devices 125A, 125B and 125C for storing data, instructions, etc. Conventional MRAM and/or STT MRAM memory devices, however, may suffer from a variety of drawbacks, as discussed in the background above. Accordingly, techniques are provided herein to fabricate improved MTJ-based memory devices. The MRAM and/or STT MRAM memory devices 125A, 125B and 125C may therefore be implemented according to one or more of the embodiments discussed below.

Although FIG. 1 illustrates remote units, the disclosure is not limited to MRAM and/or STT MRAM memory devices for these exemplary illustrated units. Embodiments of the disclosure may be suitably employed in any device which includes a magnetic memory. Embodiments of the disclosure may be suitably employed in any device which includes active integrated circuitry including memory and on-chip circuitry for test and characterization. Further, MRAM as set forth herein may operate with logic circuitry such as microprocessors. The MRAM may be integrated into devices that employ the microprocessors. For example, the MRAM may be part of a communications device, as discussed above, or any other type of circuitry without departing from the scope and spirit of the disclosure.

Figure 2:
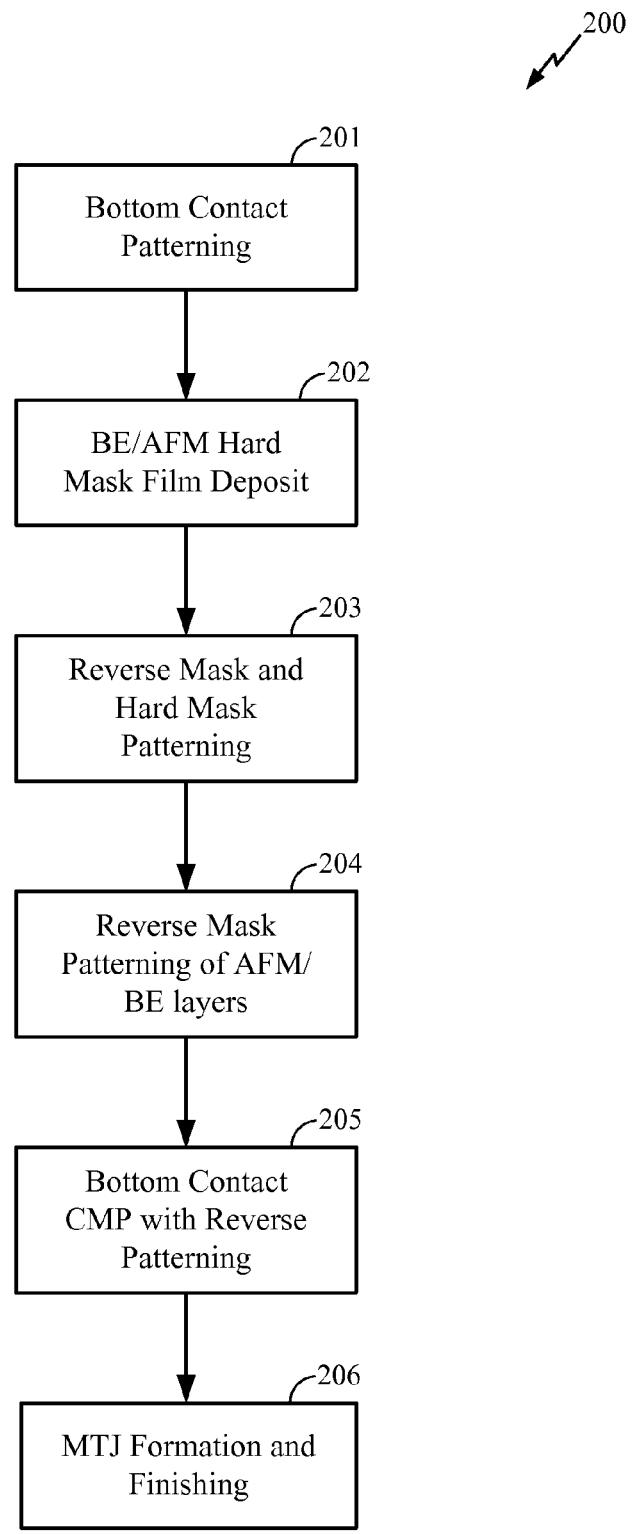
FIG. 2 is a flow chart depicting an overview of a method for fabricating an MTJ device.

FIG. 2 is a flow chart illustrating an overview of an example method for fabricating an MTJ device according to one or more embodiments. The method 200 includes patterning of a bottom contact, at 201. Several methods may be used for MTJ patterning, including ion beam etching (IBE), reactive ion etching (RIE), and wet etching. A bottom electrode (BE) layer, an anti-ferromagnetic (AFM) layer, and a hard mask film are deposited, at 202. A reverse mask and hard mask are patterned by a photo and etch process, at 203. Reverse mask patterning of AFM and BE layers is performed, at 204. The bottom contact may be formed, for example, through chemical mechanical polishing or planarization (CMP) with reverse patterning, at 205.

CMP is a process of smoothing surfaces with the bottom contact. CMP process use an abrasive and corrosive chemical slurry (e.g., a colloid) in conjunction with a polishing pad and retaining ring, typically of a greater diameter than the wafer. The pad and wafer may be pressed together by a dynamic polishing head and held in place by a plastic retaining ring. The dynamic polishing head may be rotated with different axes of rotation (i.e., not concentric). This removes material and tends to even out any irregular topography, making the wafer flat or planar.

After the initial processing shown in blocks 201-205, MTJ formation and processes are performed, at 206. The MTJ formation and finishing processes may vary, however, as illustrated by the separate examples of FIG. 3A and FIG. 3B. Accordingly, in some embodiments, after the bottom contact is formed through CMP with reverse patterning, at 205, the MTJ fabrication process continues to the processes illustrated in FIG. 3A. Alternatively, in other embodiments, after the bottom contact is formed through CMP with reverse patterning, at 205, the MTJ fabrication process continues to the fabrication processes illustrated in FIG. 3B.

Figure 3A:
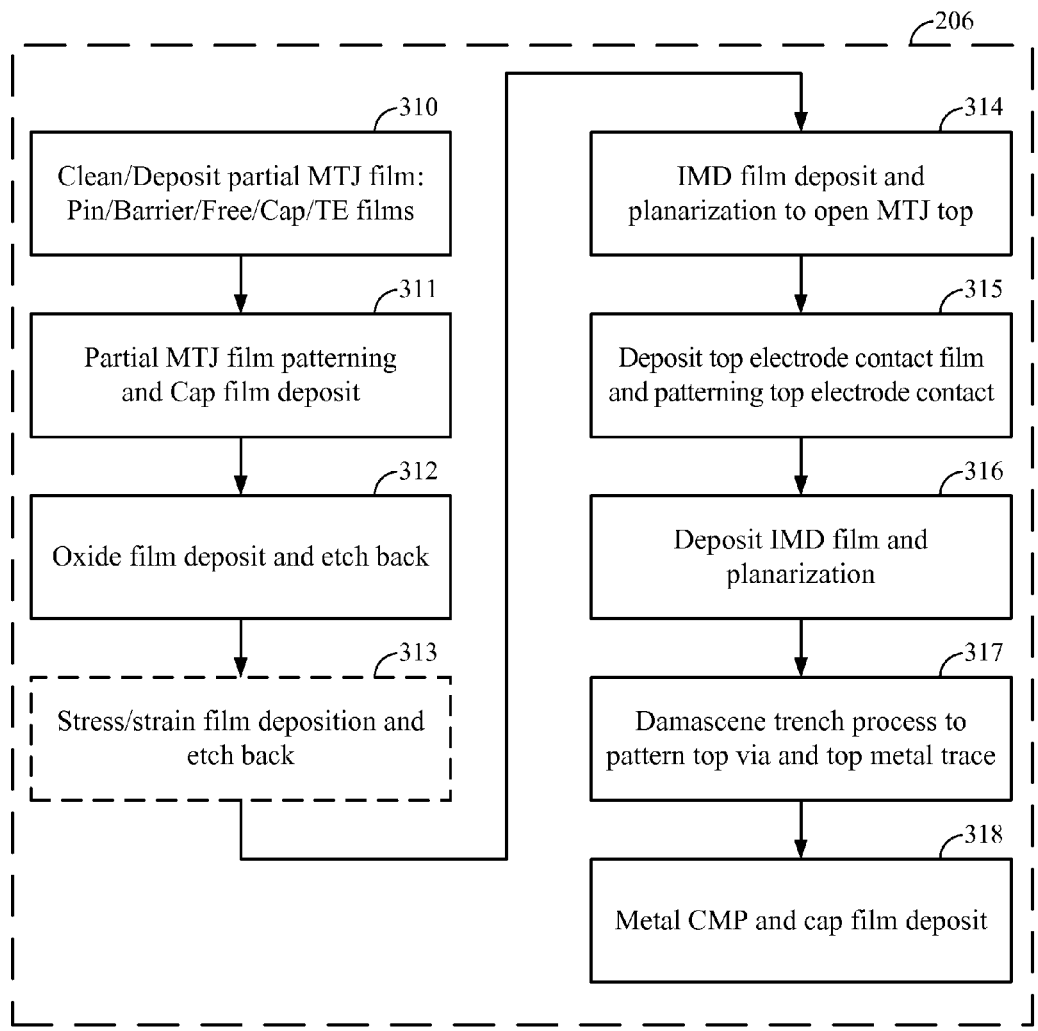
FIG. 3A is a flow chart depicting an embodiment of fabricating an MTJ device in conjunction with the flow chart of FIG. 2.

Referring to FIG. 3A, a flow chart is depicted of an embodiment with the continuing process of fabricating an MTJ device in conjunction with the flow chart of FIG. 2. From the bottom contact CMP process at 205 of FIG. 2, the MTJ fabrication continues with the cleaning and depositing of a partial MTJ film, at 310. The cleaning and depositing at 310 may include adding a pin layer, barrier layer, free layer, cap, and top electrode (TE) films. Subsequently, partial MTJ film patterning and MTJ sidewall cap film depositing is performed, at 311. An oxide film or other dielectric film deposit and etch back process is also performed, at 312. In some designs, an optional process of stress and strain film deposition and etch back may be used, at 313. Whether the stress/strain film deposition is performed or not, an IMD film deposition and planarization to open the MTJ top is performed, at 314. A top electrode contact film is then deposited and a top electrode contact is patterned, at 315. An IMD film deposition and planarization is then performed, at 316. A Damascene trench process may then be performed to pattern a top via and a top metal trace, at 317. Subsequently, a metal CMP and cap film deposit may be performed, at 318.

Figure 3B:
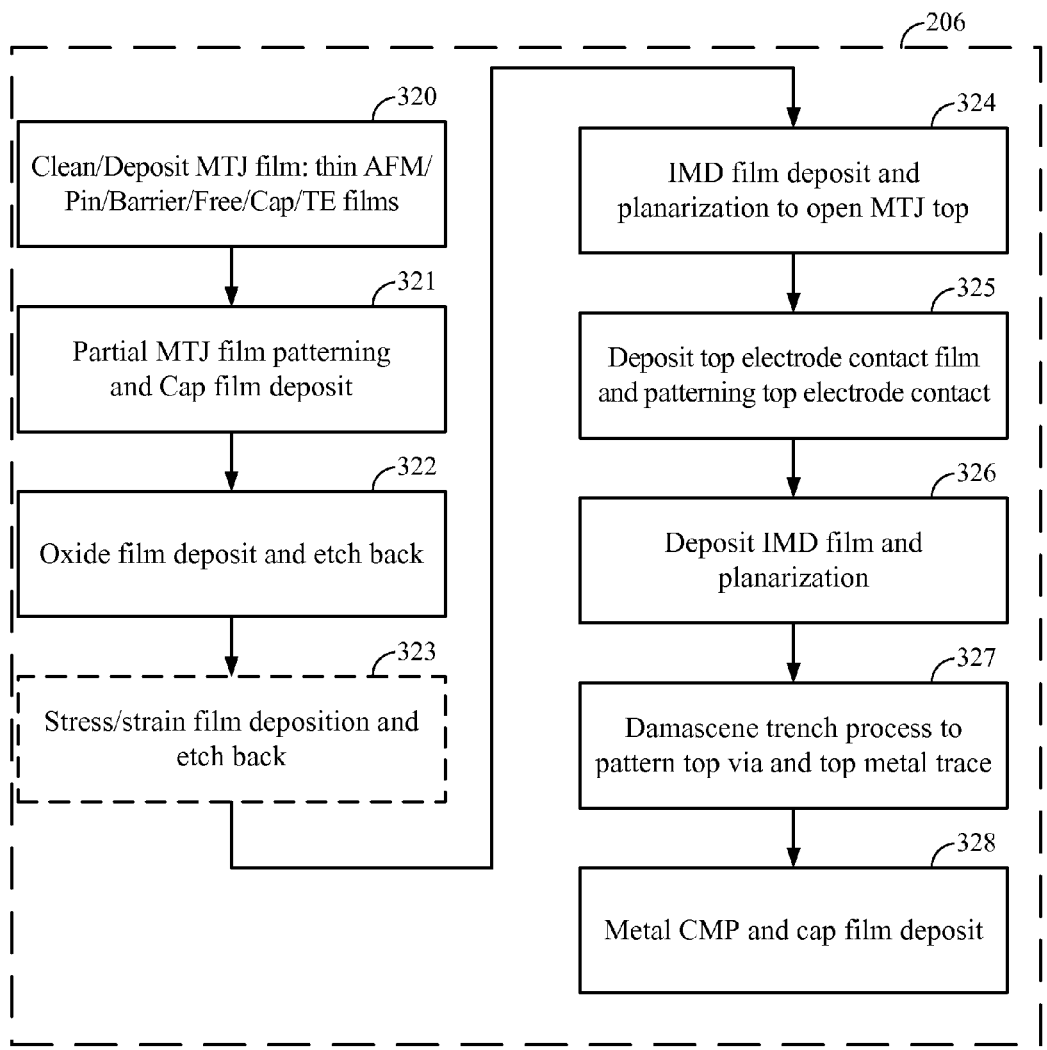
FIG. 3B is a flow chart depicting another embodiment of fabricating an MTJ device in conjunction with the flow chart of FIG. 2.

Referring to FIG. 3B, a flow chart is depicted of another embodiment with the continuing process of fabricating an MTJ device in conjunction with the flow chart of FIG. 2. From the bottom contact CMP process at 205 of FIG. 2, the MTJ fabrication continues with the cleaning and depositing of a partial MTJ film, at 320. The cleaning and depositing at 320 may include adding a thin AFM layer, a pin layer, barrier layer, free layer, cap, and top electrode (TE) films. The thin AFM layer addition, at 320, adds an additional layer in comparison with the cleaning and depositing of the partial MTJ film process at 310 of FIG. 3A. Subsequently, partial MTJ film patterning and MTJ sidewall cap film depositing is performed, at 321. An oxide film deposit and etch back process is also performed, at 322. In some designs, an optional process of stress and strain film deposition and etch back may be used, at 323. Whether the stress/strain film deposition is performed or not, an IMD film deposition and planarization to open the MTJ top is performed, at 324. A top electrode contact film is then deposited and a top electrode contact is patterned, at 325. An IMD film deposition and planarization is then performed, at 326. A Damascene trench process may then be performed to pattern a top via and a top metal trace, at 327. Subsequently, a metal CMP and cap film deposit may be performed, at 328.

The following FIGS. 4A-E illustrate in more detail the processes in the flowchart of FIG. 2.

Figure 4A:
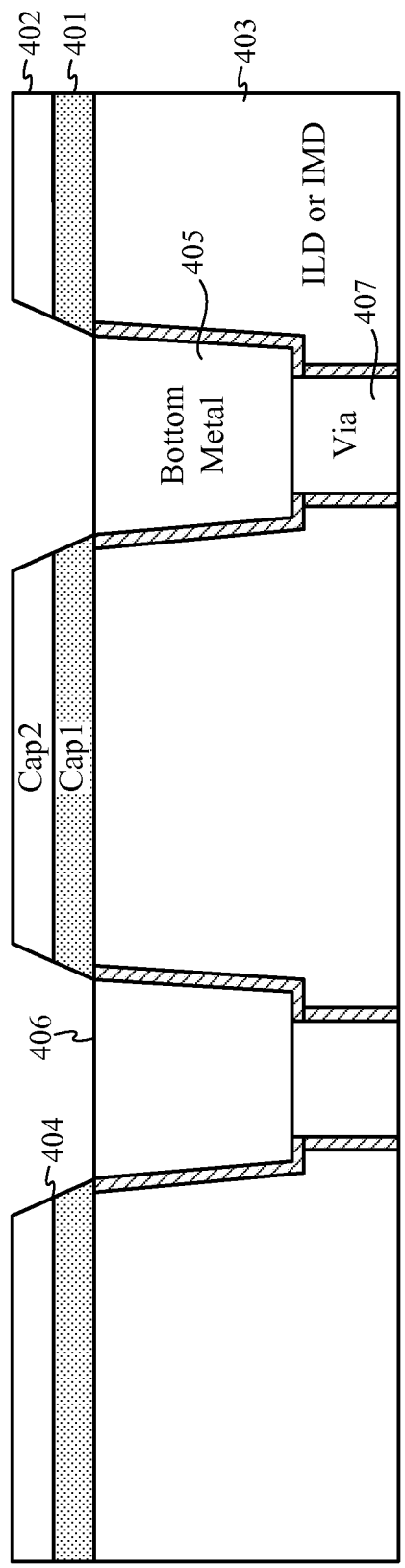
FIG. 4A is a cross-section of a magnetic tunnel junction device fabrication for a bottom contact patterning process.

FIG. 4A further illustrates the bottom contact patterning process at 201. A first cap film 401, which may be a logic baseline cap film, is disposed in a planarized layer. The planarized layer may include an inter-metal dielectric (IMD) or inter-level dielectric (ILD) 403 and a bottom metal 405 coupled to a via 407. The first cap film 401 may include SiC, SiN, or other cap film materials. As shown, a second cap film 402 is layered on top of the first cap film 401. The thickness of the second cap film 402 is adjustable. The second cap film may include SiN, SiC, or other dielectric films. A bottom contact patterning 404 may be sloped in relation to the bottom metal 405 to improve film gap filling performance and release stress. The size of a bottom contact 406 may also be adjusted to improve gap filling and to reduce CMP dishing. In addition, a bottom contact mask may be shared with a top metal mask.

Figure 4B:
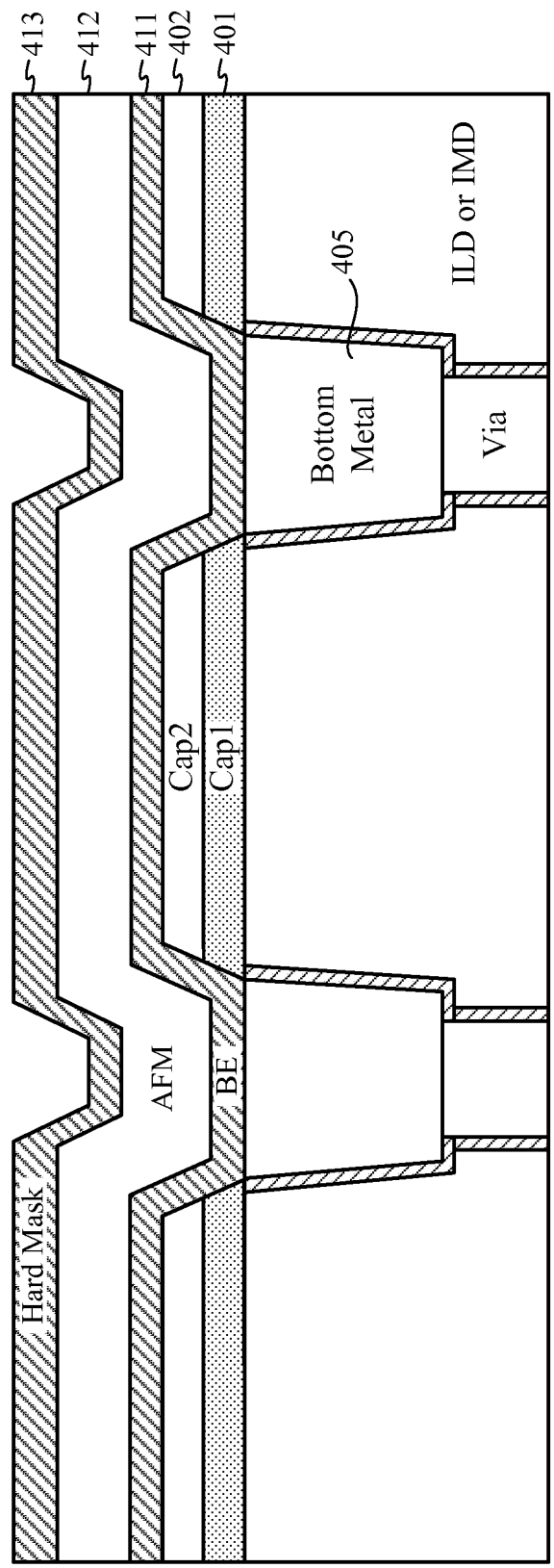
FIG. 4B is a cross-section of a magnetic tunnel junction device fabrication for a BE and AFM and hard mask film deposit.

FIG. 4B further illustrates the BE layer, AFM layer, and Hard Mask film deposition at 202. As shown, a BE layer 411 is deposited over the open surface of the second cap film 402, the first cap film 401, and the bottom metal 405. An AFM layer 412 is deposited on top of the BE layer 411. A hard mask 413 is deposited on top of the AFM layer 412. The BE layer 411 may include, but is not limited to, Ta or TaN. Different BE layer 411 films may be selected depending on the fabrication mechanism to reduce film stress and promote improved gap filling. The AFM layer 412 may include, but is not limited to, PtMn or PtIr. The hard mask 413 may include, but is not limited to, Ta or TaN.

Figure 4C:
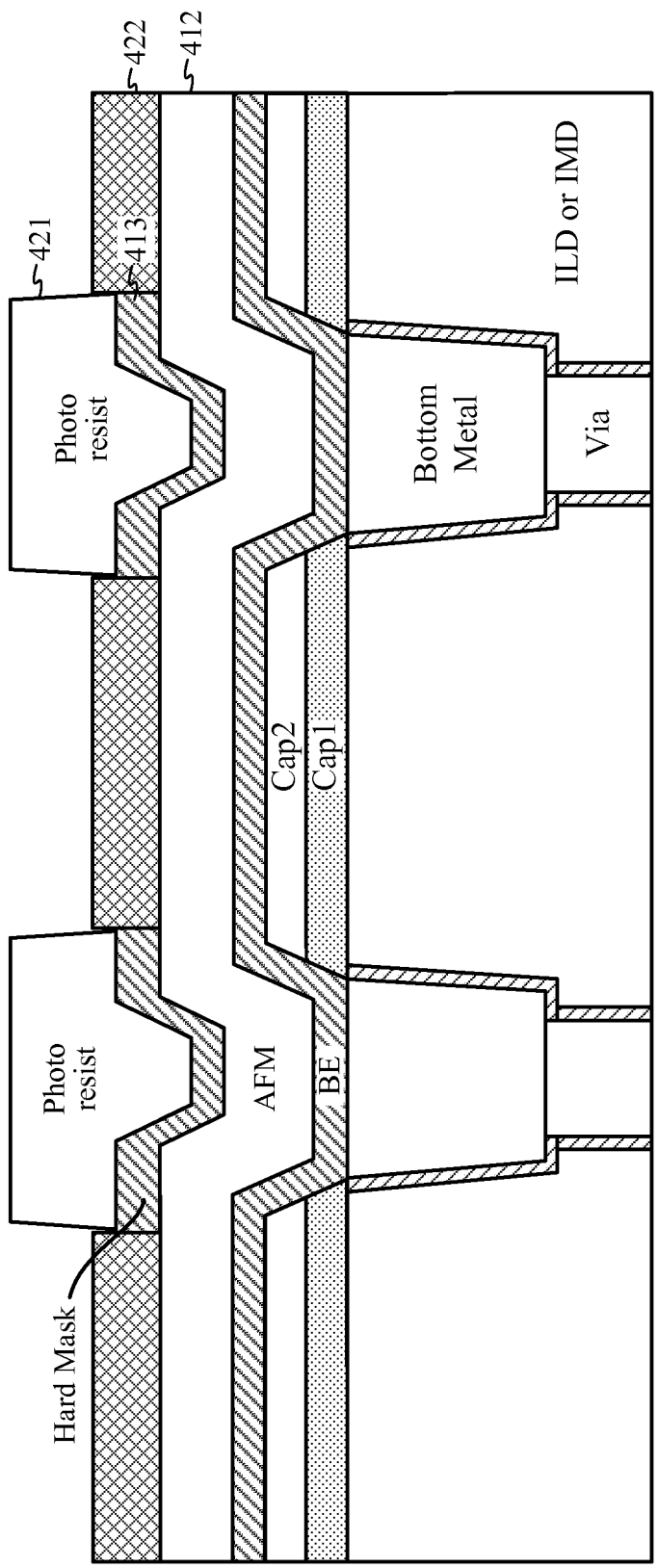
FIG. 4C is a cross-section of a magnetic tunnel junction device fabrication for a reverse mask and hard mask patterning process.

FIG. 4C illustrates the reverse mask and hard mask patterning at 203 in more detail. This process incorporates the reverse mask patterning of the hard mask 413 for the AFM layer 412 etch. The reverse mask process may use a low resolution mask to reduce cost. The reverse mask process may share a top electrode contact (TEC) mask. A photo resist 421 may be utilized to remove the extra hard mask off the AFM layer 412 in the area 422 that is not in the same substantial axis of the bottom metal 405. The photo resist 421 may also act as an etch stop.

Figure 4D:
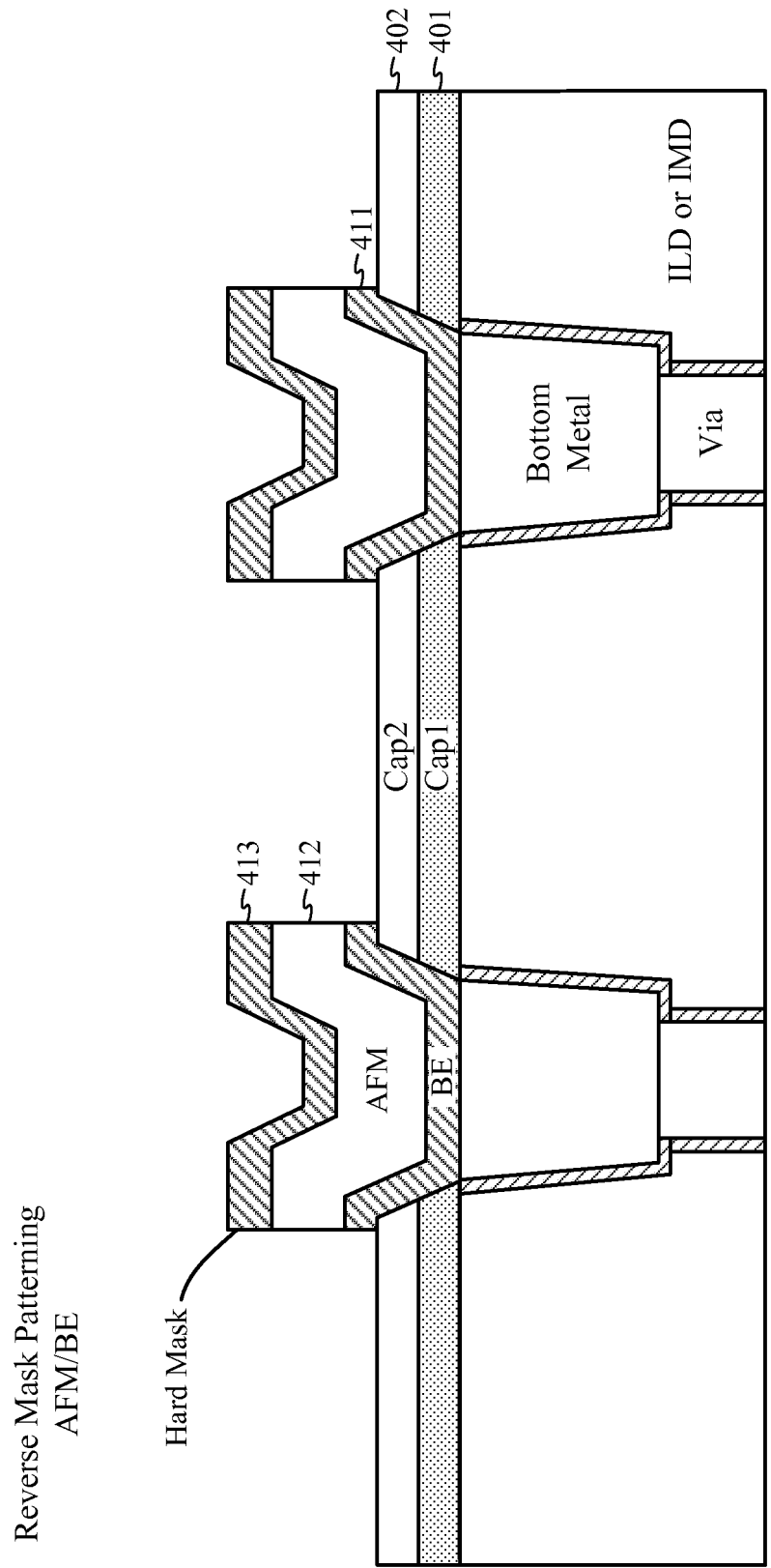
FIG. 4D is a cross-section of a magnetic tunnel junction device fabrication for a reverse mask patterning of AFM and BE layers.

FIG. 4D illustrates the hard mask reverse mask patterning of AFM and BE layers at 204, in more detail. The reverse mask process removes the extra AFM layer 412 and BE layer 411. This process may utilize the area, or etch stop, from the removal of the hard mask 413 in the reverse mask process 203 as a guide to remove the AFM layer 412 and BE layer 411. This may improve CMP uniformity and reduce surface roughness of the bottom contact. The second cap film 402 may be used as a CMP stop layer to improve CMP uniformity. The thickness of the second cap film 402 may be used to adjust the BE layer 411 and AFM layer 412 thickness.

Figure 4E:
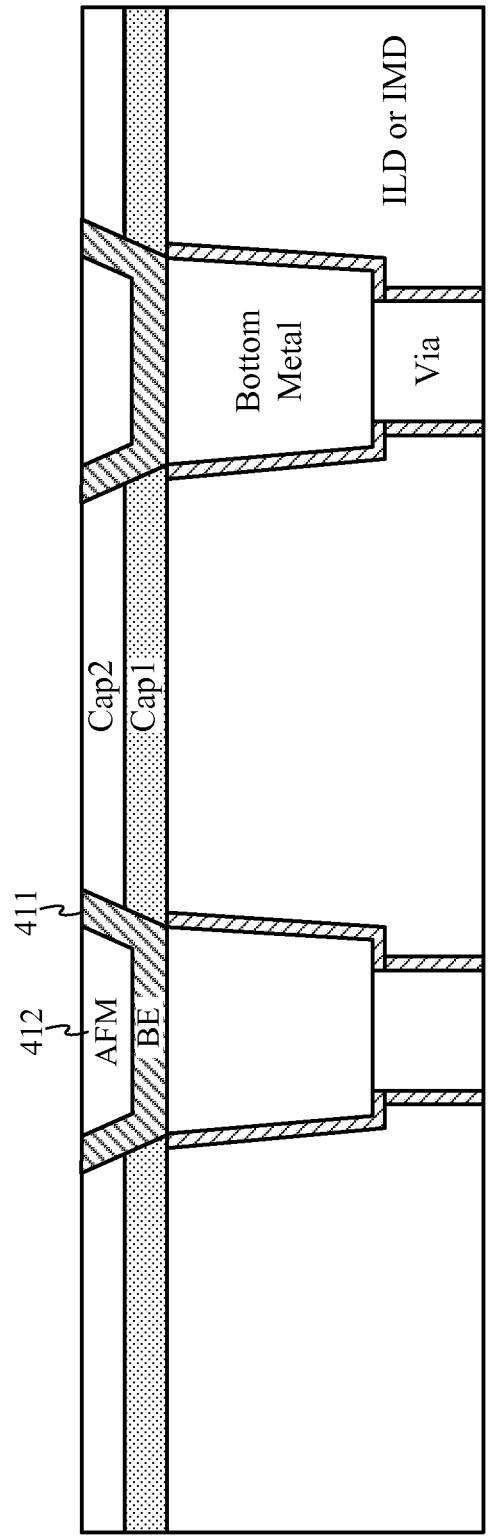
FIG. 4E is a cross-section of a magnetic tunnel junction device fabrication for a bottom contact CMP with reverse patterning.

FIG. 4E illustrates the bottom contact CMP with reverse patterning process at 205, which may be utilized to reduce surface roughness. In addition, an adjustable bottom contact size may prevent CMP dishing. CMP dishing, or over-polishing, may occur because there are other places on the wafer where the metal has not yet been cleared. CMP dishing may occur because the polish process or the original metal thickness is not uniform across the wafer, and as a result, the BE layer 411 and AFM layer 412 are dished out. The local bottom contact surface roughness may be better controlled by an optimized CMP process. The bottom contact CMP with reverse patterning may be utilized, in part, because MRAM array MTJs are sensitive to local surface roughness instead of global thickness control.

The following FIGS. 5A-H illustrate in more detail the MTJ formation and finishing processes in some embodiments according to the flowchart of FIG. 3A. The MTJ structure in this design has a relatively large bottom contact and filling to reduce parasitic resistance. In addition, the MTJ structure has a sloped bottom contact to improve BE and AFM layer gap filling and release stress on the structure. This design allows for a relatively tunable bottom contact area to prevent CMP dishing and reduce surface roughness. In addition, an oxide film or dielectric spacer may be used as a hard mask to remove the second cap film in order to be compatible with logic back end of line (BEOL) integration. Another aspect of this design is that it may use a strain film spacer to reduce MTJ switching current.

Back-end-of-line (BEOL) denotes the second portion of IC fabrication where the individual devices (e.g., transistors, capacitors, resistors) are interconnected with wiring on the wafer. BEOL generally begins when the first layer of metal is deposited on the wafer. It includes contacts, insulating layers (e.g., dielectrics), metal levels, and bonding sites for chip-to-package connections. After a BEOL step there is a wafer with isolated transistors without any wires. In the BEOL part of fabrication, stage contacts (e.g., pads), interconnect wires, vias and dielectric structures are formed.

Figure 5A:
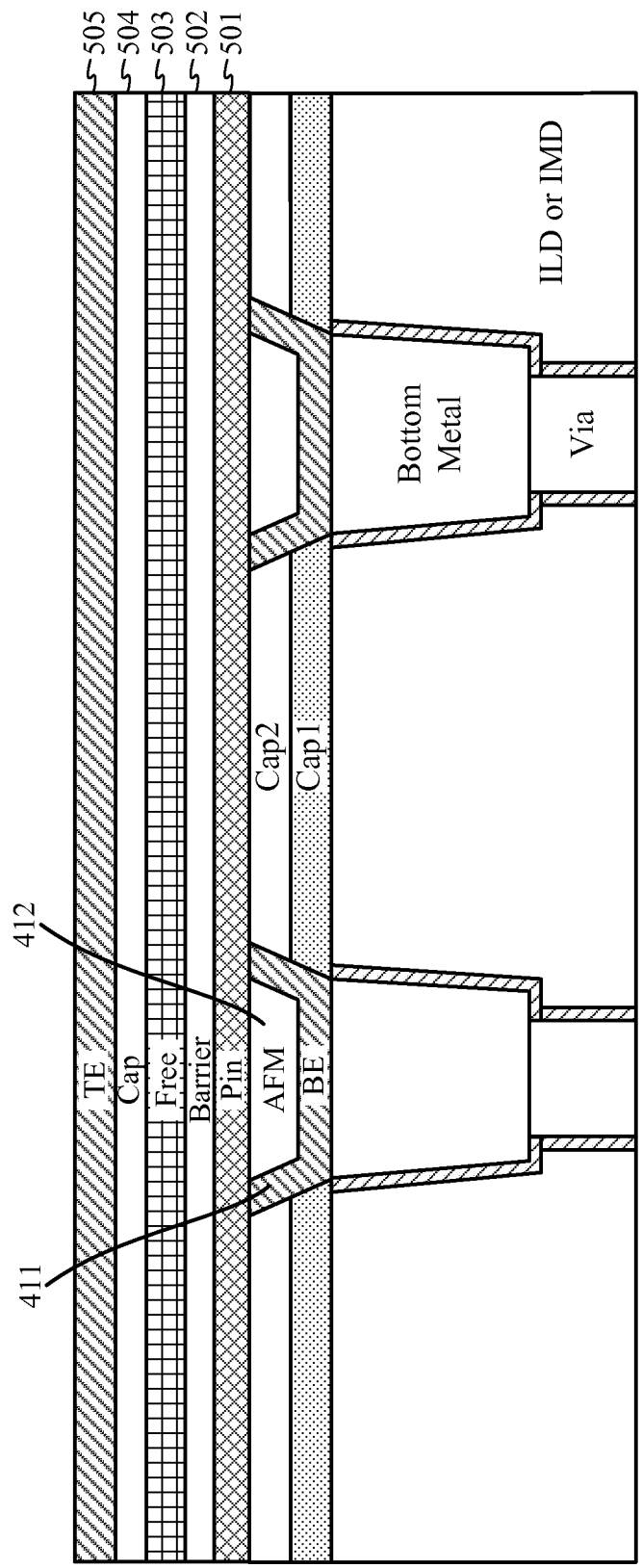
FIG. 5A is a cross-section of a magnetic tunnel junction device fabrication for a partial MTJ film deposition process.

FIG. 5A illustrates the MTJ film deposition process at 310 in more detail. First, the surface is cleaned. The cleaning process may be wet and/or dry plasma cleaning or treatment to remove a surface oxidation layer and reduce surface roughness after process 205. The cleaning step may be important for a pin layer 501 to be pinned with AFM layer 412. Then, a partial MTJ film, which can include a pin layer 501, a barrier 502, a free layer 503, a cap layer 504 and a top electrode (TE) layer 505, is deposited over the surface of the second cap film 402, BE layer 411 and AFM layer 412. The pin layer 501 may include, but is not limited to, CoFe, or CoFeB or CoFe/Ru/CoFeB combination layer or other magnetic materials. The barrier 502 may include, but is not limited to, MgO or AlOx. The barrier 502 may be formed by sputtering or oxidation. The free layer 503 may include CoFeB or other magnetic materials. The cap layer 504 may be used to protect the free layer and induce a perpendicular isotropic moment to reduce the critical current density ($J_c$) of the MTJ. The top electrode (TE) layer 505 may be used as a hard mask and connection path for the MTJ. The TE 505 may include, but is not limited to, Ta or TaN.

Figure 5B:
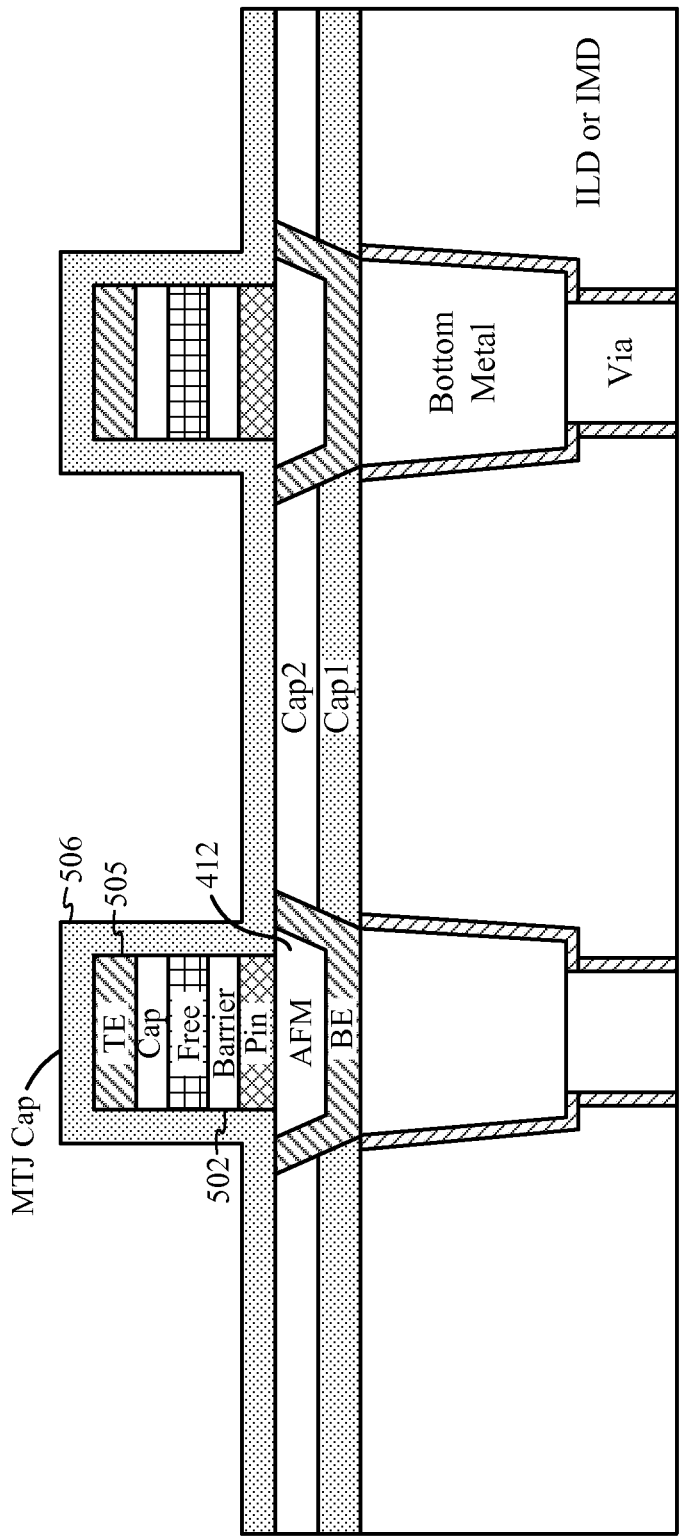
FIG. 5B is a cross-section of a magnetic tunnel junction device fabrication for an MTJ patterning and cap film deposit process.

FIG. 5B illustrates the partial MTJ patterning and cap film deposit process at 311 in more detail. The MTJ patterning may be performed via the TE 505 hard mask. A partial MTJ etch is used to punch through the MTJ barrier. Partial MTJ patterning and cap film deposition may not require an MTJ etch stop on the barrier layer 502 or AFM layer 412. This may enlarge an MTJ etch process window and reduce MTJ sidewall damage. Any extra films may be removed in subsequent processes. For example, the MTJ etch may stop on the AFM layer 412. However, the MTJ etch may alternatively stop on any layer of the barrier or pin layer, in accordance with user preference. An MTJ cap layer 506 may be deposited to protect the MTJ.

Figure 5C:
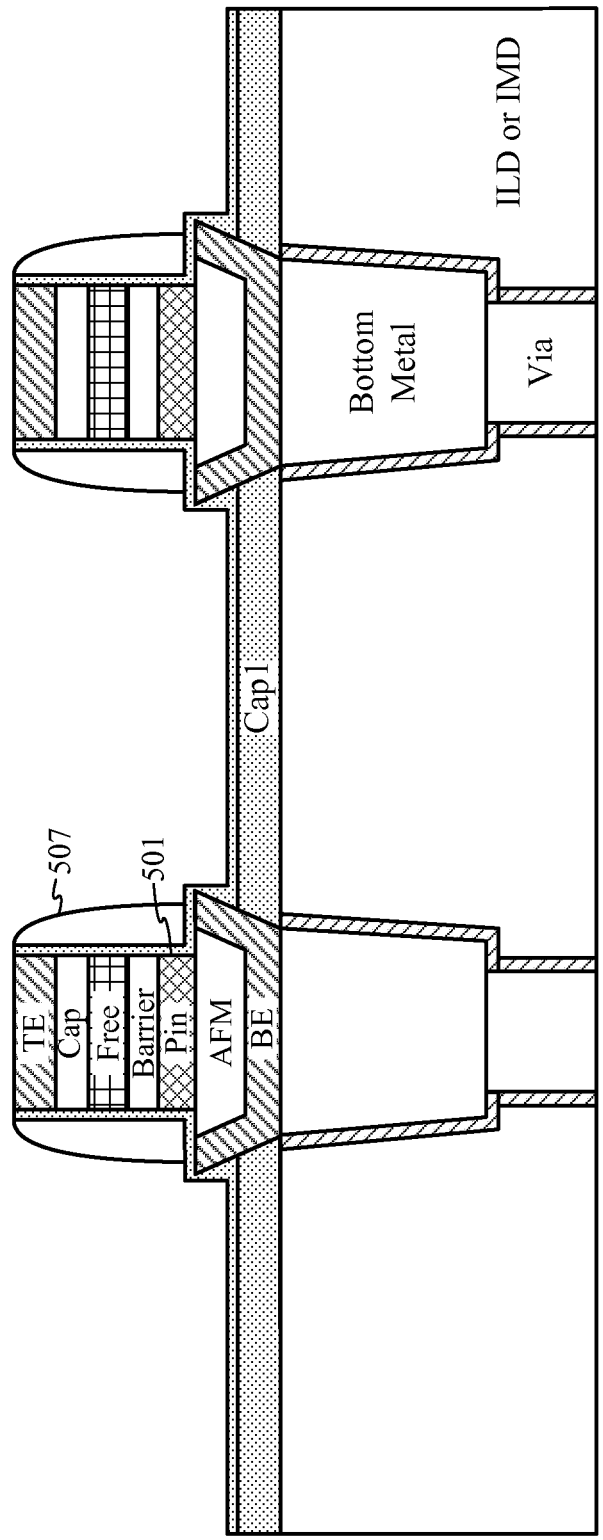
FIG. 5C is a cross-section of a magnetic tunnel junction device fabrication for an oxide film deposit and etch back.

FIG. 5C illustrates the oxide film or dielectric film deposit and etch back process at 312 in more detail. The oxide film or dielectric film deposit and etch back is utilized to form an oxide spacer 507. By using oxide spacer 507 as a hard mask, the MTJ cap layer 506 (not pictured in FIG. 5C) may be etched back, and any remaining pin layer 501 or bottom of second cap film 402 (not pictured in FIG. 5C) may be removed. The pin layer 501 in the illustrated MTJ structure may be very thin. In addition, no mask is required for the illustrated oxide film deposit and etch back. By removing the second cap film 402, the MRAM process is maintained compatible with logic process and BEOL integration. As a result, the MTJ structure in this design may be used for an embedded MRAM process flow.

Figure 5D:
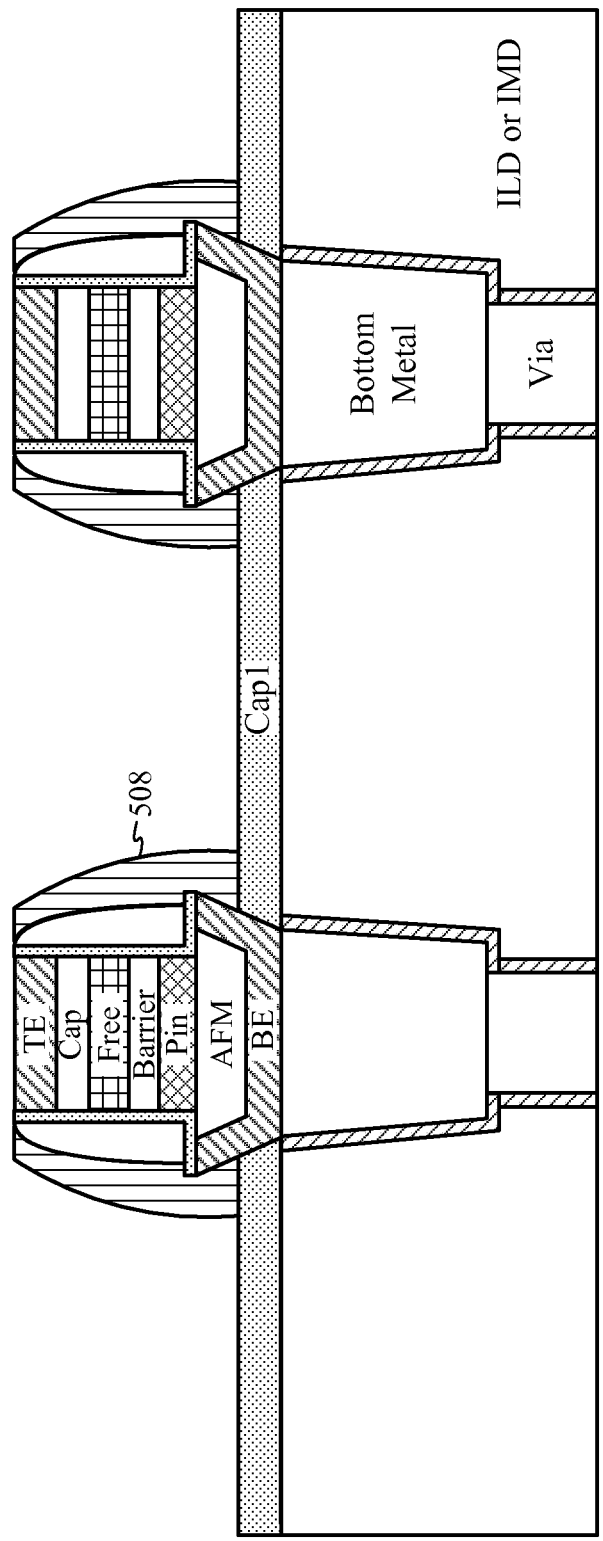
FIG. 5D is a cross-section of a magnetic tunnel junction device fabrication for a stress and strain film deposit and etch back.

FIG. 5D illustrates the stress and strain film deposition and etch back process at 313 in more detail. This is an optional step. As shown, stress and strain film 508 may be deposited and etched back for perpendicular MTJ structures. Alternatively, patterning with the stress mask and etching back for in-plane MTJ structures (not pictured) or perpendicular MTJ structures may be performed. The stress and strain film 508 may be applied to a long or short axis of in-plane MTJ structures or perpendicular MTJ structures. By using a selective stress and strain film patterning mask, the critical current density ($J_c$) of the MTJ may be reduced.

Figure 5E:
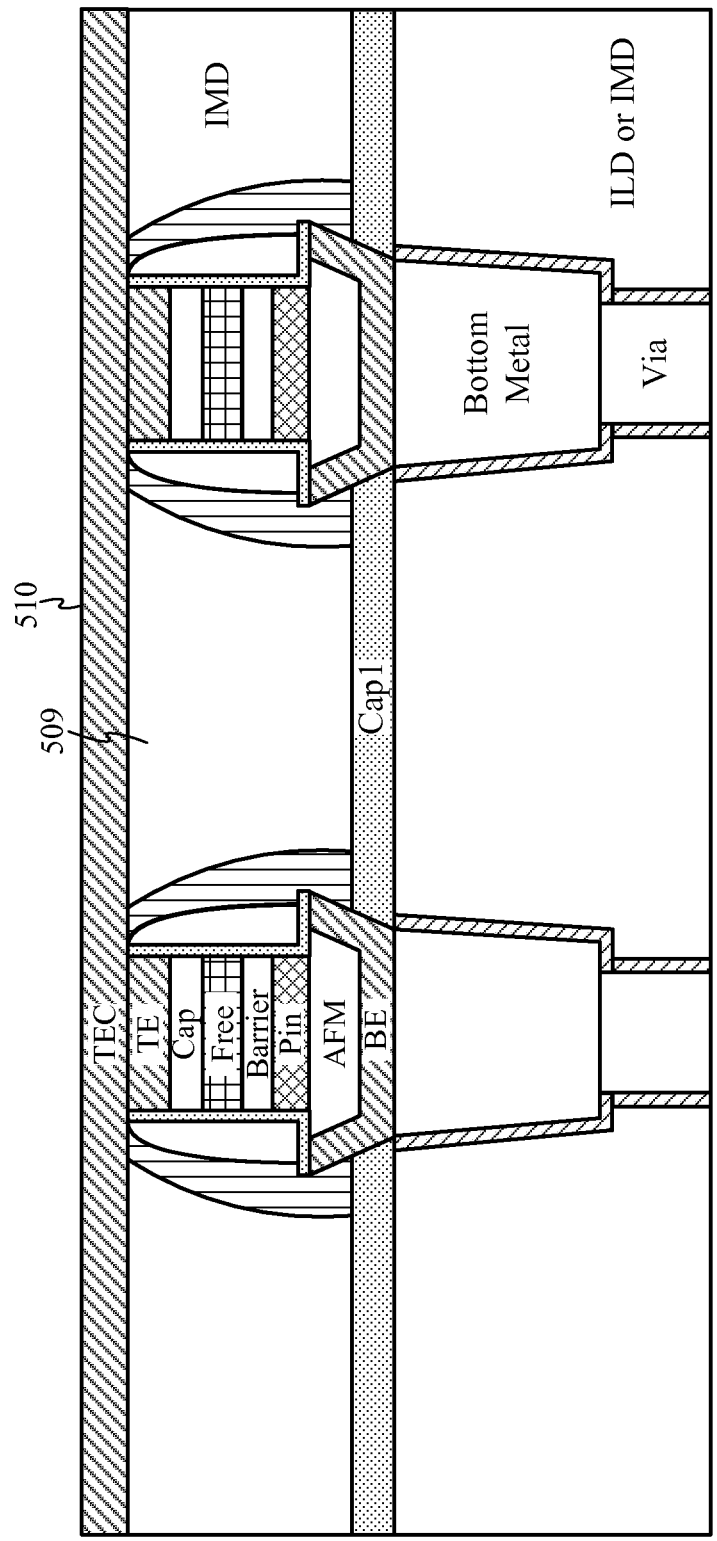
FIG. 5E is a cross-section of a magnetic tunnel junction device fabrication for an IMD film deposit and planarization.

FIG. 5E illustrates the IMD film deposit and planarization process at 314 in more detail. The IMD film 509 is deposited and may include an oxide, low-k oxide, or a combination thereof. IMD planarization may be utilized to open the top of the MTJ. Planarization may include, but is not limited to, CMP or etch back with spin on materials. Subsequently, a cleaning process may be performed. The top electrode contact (TEC) film 510 may then be deposited. The TEC film 510 may be, but is not limited to, Ta, TaN, Ti, TiN, or a combination thereof.

Figure 5F:
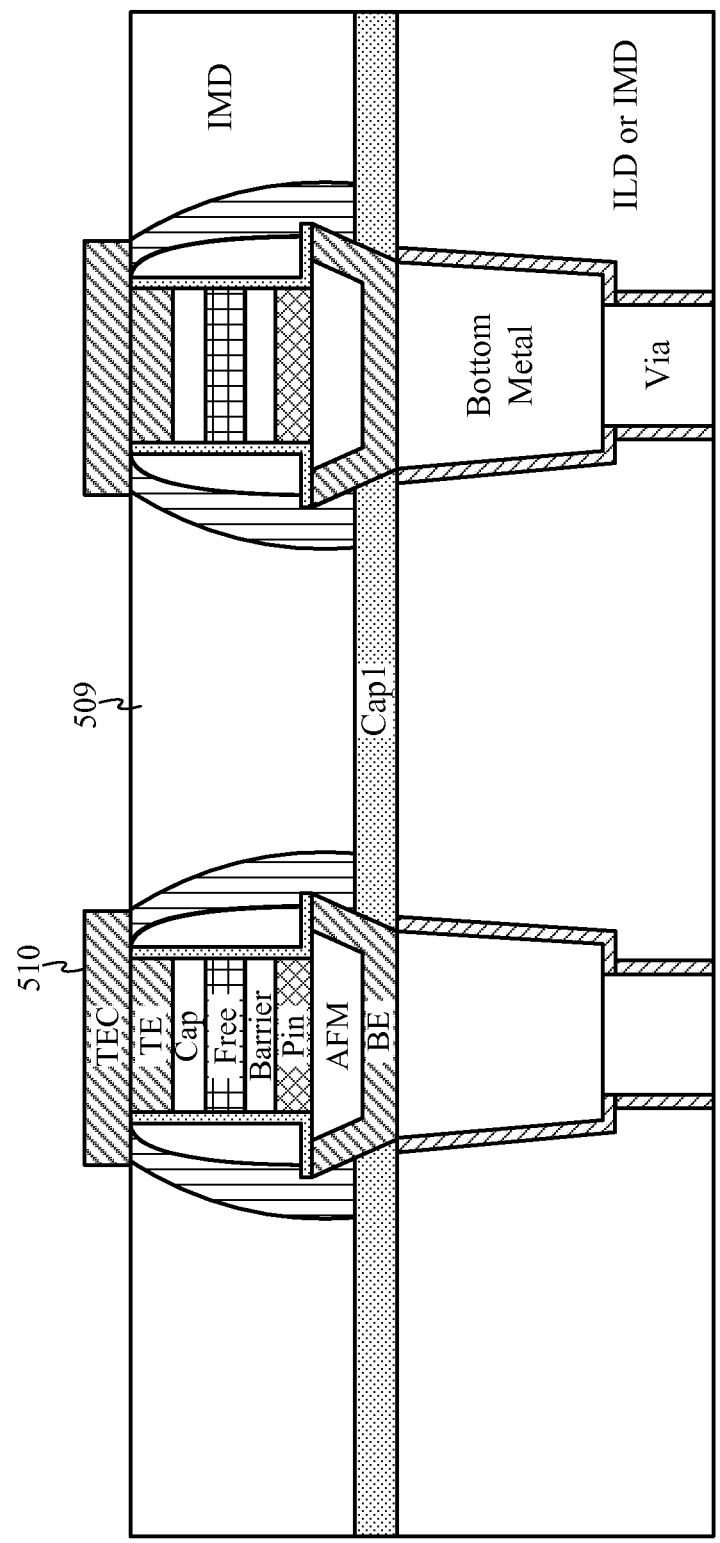
FIG. 5F is a cross-section of a magnetic tunnel junction device fabrication for a TEC patterning.

FIG. 5F illustrates the TEC patterning process at 315. A TEC film 510 patterning is performed, which may stop on IMD film 509. The TEC film 510 mask may be shared with the reverse mask. The IMD film 509 gap may be shallow, which facilitates the gap filling process 316. As a result, process 315 may improve the process margin of the fabrication of the MTJ structure.

Figure 5G:
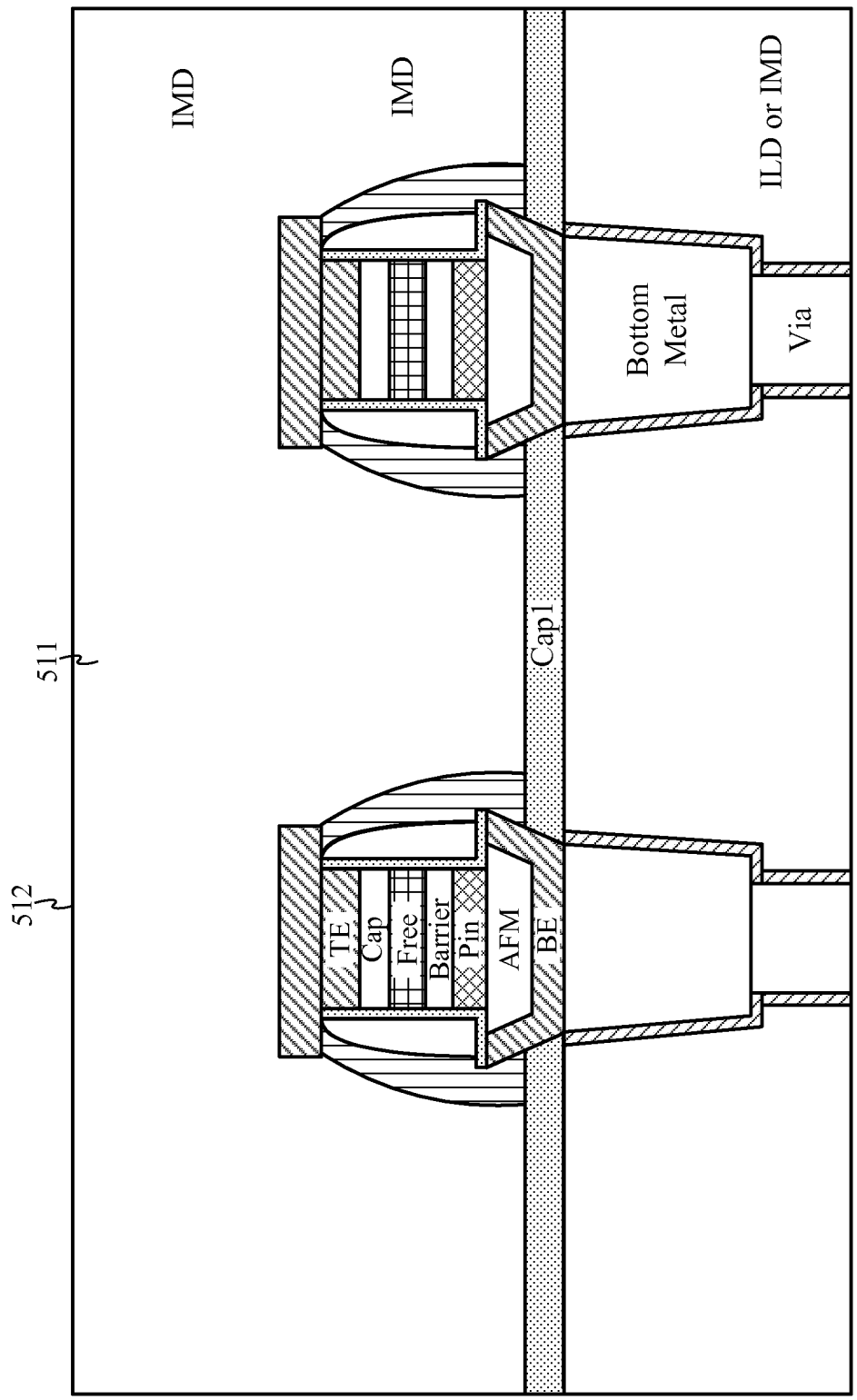
FIG. 5G is a cross-section of a magnetic tunnel junction device fabrication for an IMD film deposit and CMP.

FIG. 5G illustrates the IMD film deposit and CMP process at 316. The IMD film 511 is deposited to fill gaps. Then, a CMP process of the IMD film 511 is performed for planarization of the IMD surface 512.

Figure 5H:
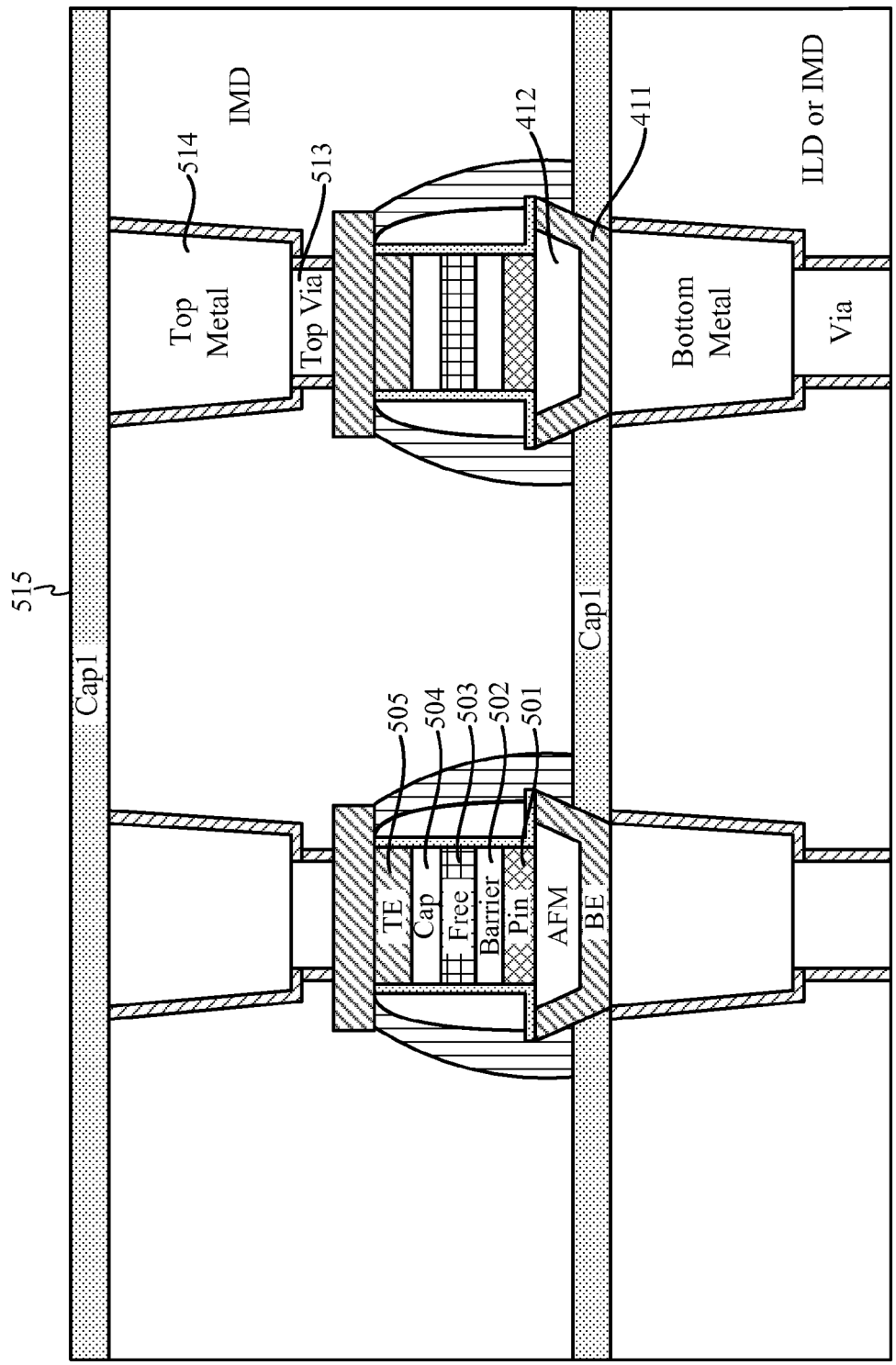
FIG. 5H is a cross-section of a magnetic tunnel junction device fabrication for forming a top via and top metal connection.

FIG. 5H illustrates the forming of the top via 513 and top metal connection 514 process at 317. Process 317 may use trench and copper plating, as well as CMP for the top via 513 and top metal connection 514. The top via height 513 may be adjustable in accordance with user preference. Subsequently, another cap film layer 515 is deposited to protect the top metal connection 514.

As shown in FIG. 5H, the MTJ includes a partial MTJ etch comprising a top electrode, a cap layer, a free layer, a barrier, and a pin layer. The MTJ structure with the partial MTJ etch may help improve MTJ size and uniformity. The MTJ partial etch may also reduce sidewall damage.

The following FIGS. 6A-H illustrate an alternative MTJ structure according to the fabrication process depicted in the flowchart of FIG. 3B. FIGS. 6A-H are similar to FIGS. 5A-H except that there is an additional thin AFM layer deposition. Therefore, a MTJ structure according to this embodiment has an added thin AFM layer between the pin layer and the BE/AFM layers.

The MTJ structure in this embodiment has a relatively large bottom contact and filling to reduce parasitic resistance. In addition, the MTJ structure has a sloped bottom contact to improve BE and AFM layer gap filling and release stress on the structure. This allows for a relatively tunable bottom contact area to prevent CMP dishing and reduce surface roughness. In addition, an oxide film spacer may be used as a hard mask to remove the second capacitor in order to be compatible with logic back end of line (BEOL) integration. This design may also use a strain film spacer to reduce MTJ switching current.

Figure 6A:
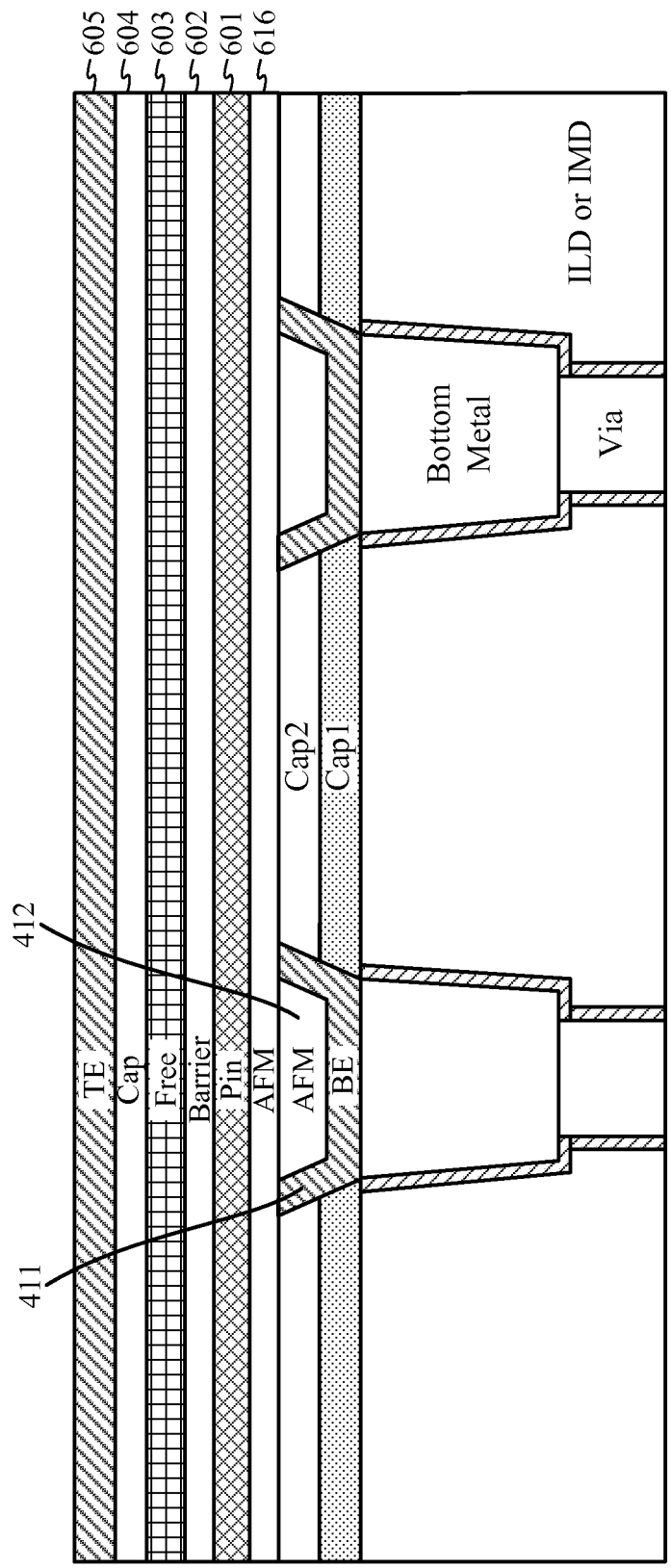
FIG. 6A is a cross-section of a magnetic tunnel junction device fabrication for an MTJ film deposition process.

FIG. 6A illustrates the MTJ film deposition process at 320 in more detail. First, the surface is cleaned. The cleaning process may include wet and/or dry plasma cleaning or treatment to remove a surface oxidation layer and reduce surface roughness. The cleaning step may be important for a thin AFM layer 616 to be pinned with AFM layer 412. Then, an MTJ film, which may include the thin AFM layer 616, pin layer 601, a barrier 602, a free layer 603, a cap layer 604 and a top electrode (TE) layer 605, is deposited over the surface of the second cap film 402, BE layer 411 and AFM layer 412. The thin AFM layer may improve pinning strength between pin layer 601 and the AFM layer 412 by in-situ deposition. The pin layer 601 may include, but is not limited to, CoFe, or CoFeB or CoFe/Ru/CoFeB combination layer or magnetic materials. The barrier 602 may include, but is not limited to, MgO or AlO. The barrier layer 602 may be formed by sputtering or oxidation. The free layer 603 may include CoFeB or other magnetic materials. The cap layer 604 may be used to protect the free layer and induce perpendicular isotropic moment to reduce the critical current density (Jc) of the MTJ. The top electrode (TE) layer 605 may be used as a hard mask and connection path of the MTJ. The TE layer 605 may include, but is not limited to, Ta or TaN.

Figure 6B:
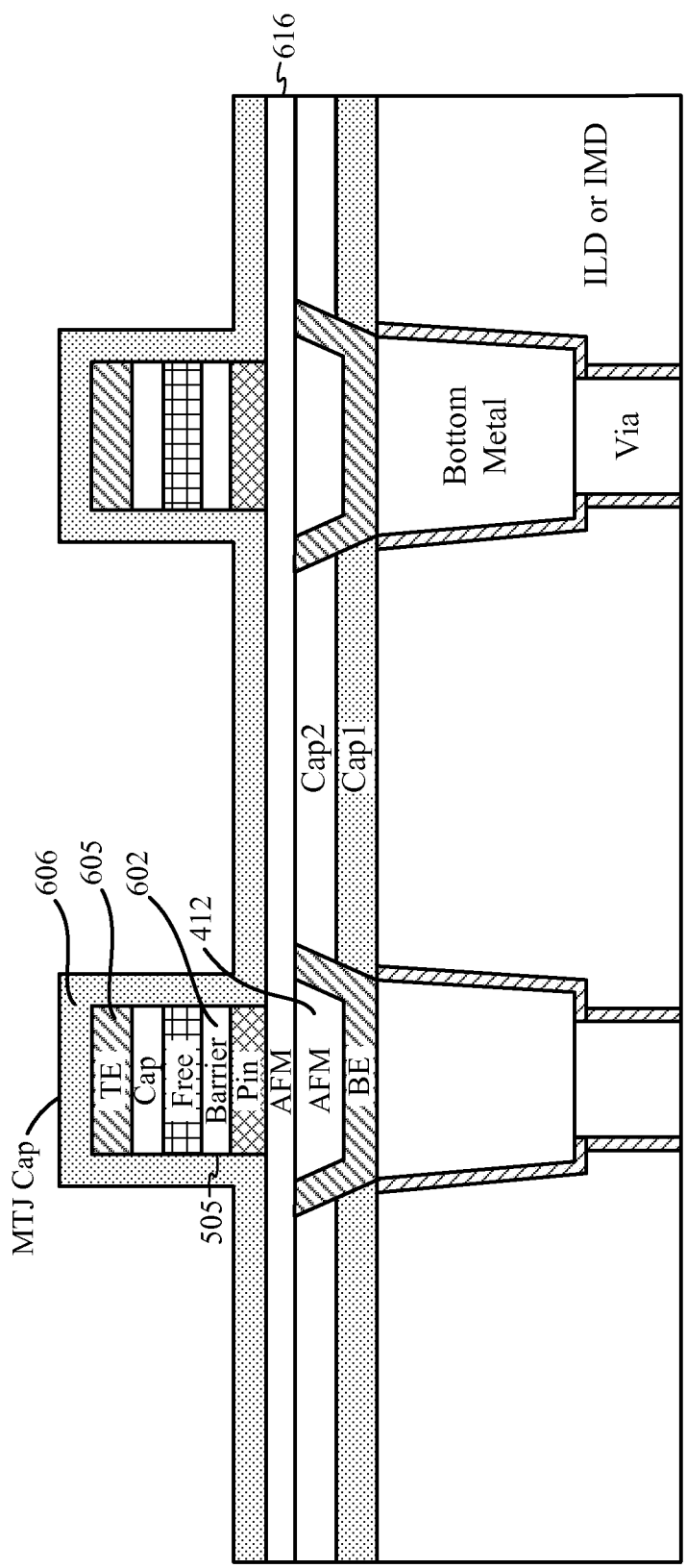
FIG. 6B is a cross-section of a magnetic tunnel junction device fabrication for an MTJ patterned and cap film deposit process.

FIG. 6B illustrates the MTJ patterning and cap film deposition process at 321 in more detail. The MTJ patterning may be performed via the TE layer 605 hard mask. A partial MTJ etch is used to punch through the MTJ barrier. An MTJ etch stop is not required on the barrier layer 602, AFM layer 412, or thin AFM layer 616. This may enlarge an MTJ etch process window and reduce MTJ sidewall damage. Any extra films may be removed in subsequent processes. For example, the MTJ etch may stop on the AFM layer 412. However the MTJ etch may alternatively stop on any layer of the thin AFM layer, pin or barrier layer, according to user preference. Subsequently, an MTJ cap layer 606 is deposited to protect the MTJ.

Figure 6C:
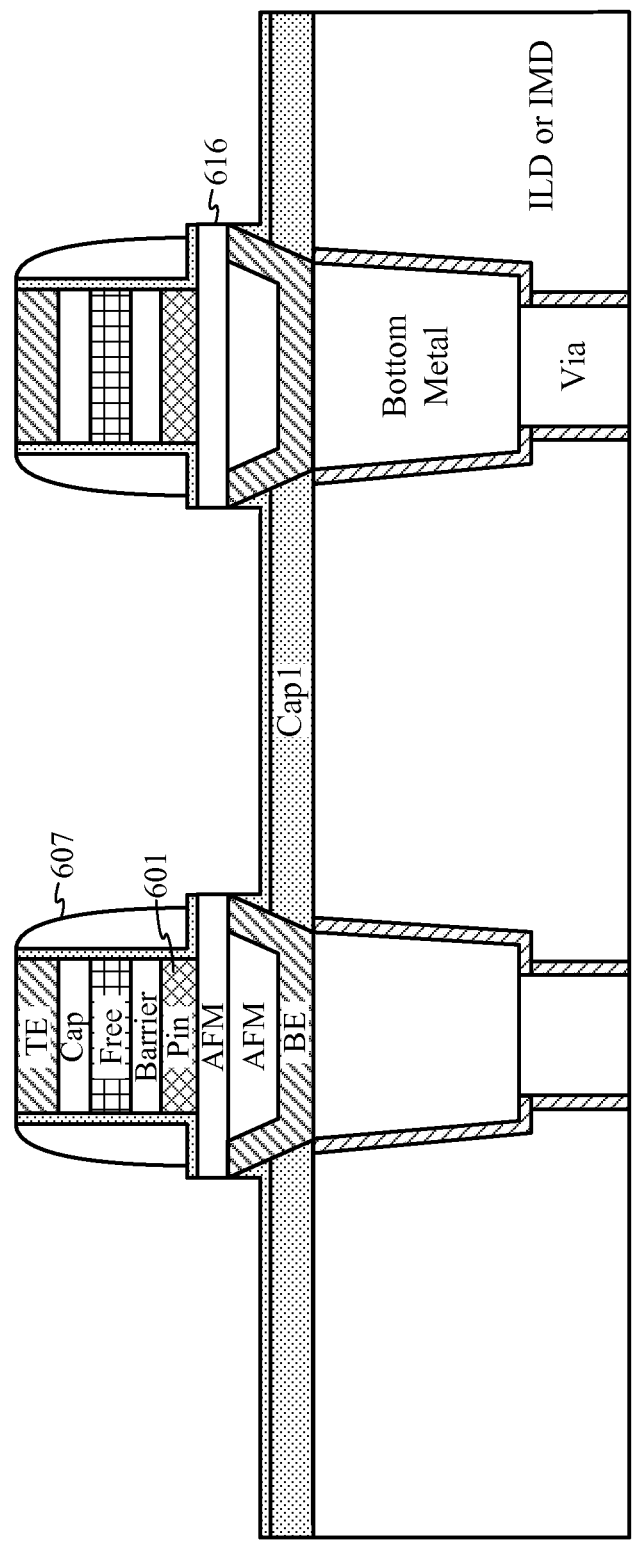
FIG. 6C is a cross-section of a magnetic tunnel junction device fabrication for an oxide film deposit and etch back.

FIG. 6C illustrates the oxide film or dielectric film deposit and etch back process at 322. The oxide film deposit and etch back may be utilized to form an oxide spacer 607. By using oxide spacer 607 as a hard mask, the MTJ cap layer 606 (not pictured in FIG. 6C since it is removed) is etched back and any remaining pin layer 601, AFM layer 616 or bottom of second cap film 402 (not pictured in FIG. 6C) is removed. The pin layer 601 in the MTJ structure may be made relatively thin. In addition, no mask is required for process 322. By removing the second cap film 402, the MRAM process may be maintained compatible with logic process and BEOL integration. As a result, the MTJ structure in this design may be used for embedded MRAM process flow.

Figure 6D:
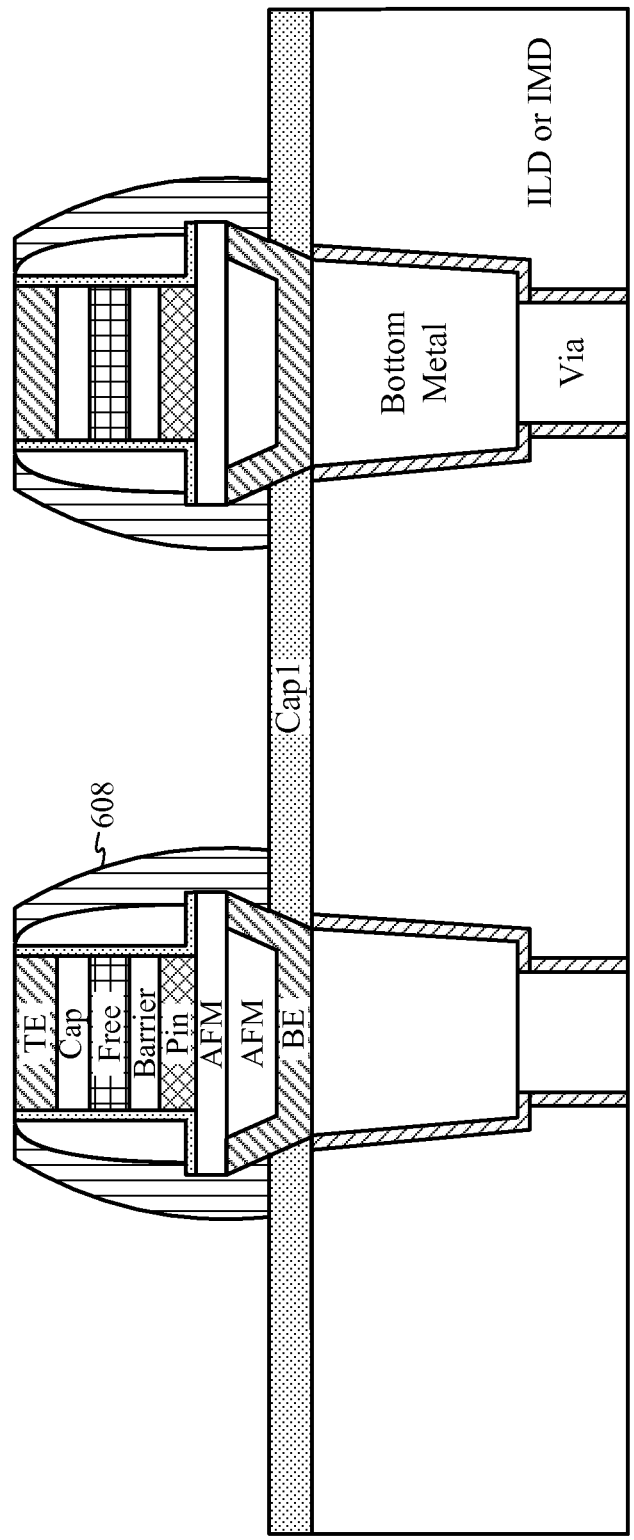
FIG. 6D is a cross-section of a magnetic tunnel junction device fabrication for a stress and strain film deposit and etch back.

FIG. 6D illustrates the stress and strain film deposit and etch back process at 323, which is an optional step. Stress and strain film 608 may be deposited and etched back for perpendicular MTJ structures. Alternatively, patterning with a stress mask and etching back may be used for in-plane MTJ structures (not pictured) or perpendicular MTJ structures. The stress and strain film 608 may be applied to a long or short axis of in-plane MTJ structures or perpendicular MTJ structures. By using a selective stress and strain film patterning mask, the critical current density ($J_o$) of the MTJ may be reduced.

Figure 6E:
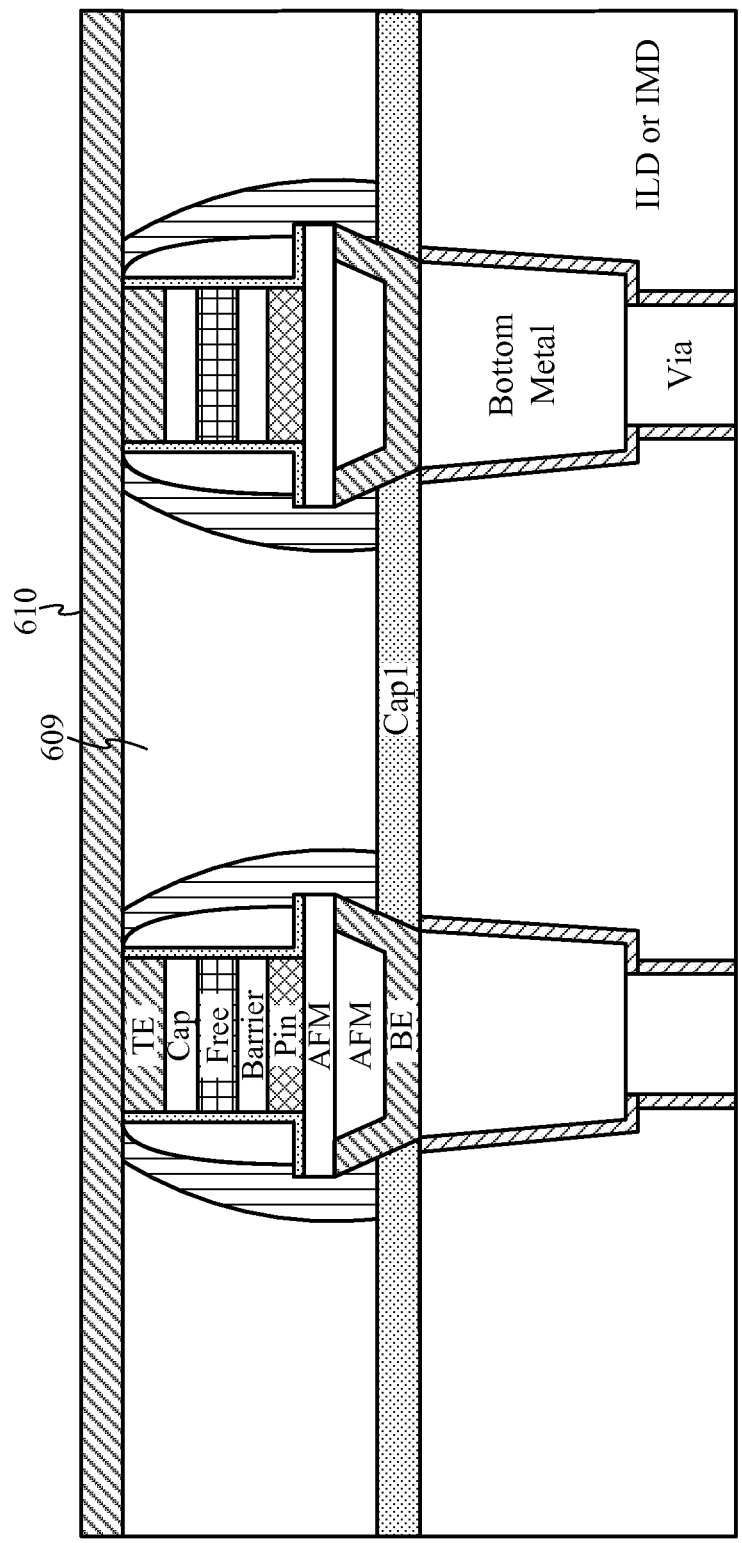
FIG. 6E is a cross-section of a magnetic tunnel junction device fabrication for an IMD film deposit and planarization.

FIG. 6E illustrates the IMD film deposit and planarization process at 324. The IMD film 609 may be deposited and may include an oxide, low-k oxide, or combination thereof. An IMD planarization process may be utilized to open the top of the MTJ. Planarization may include, but not limited to, CMP or etch back with spin on materials. Subsequently, a cleaning process may be performed. The top electrode contact (TEC) film 610 may then be deposited. The TEC 610 may include, but is not limited to, Ta, TaN, Ti, TiN, or a combination thereof.

Figure 6F:
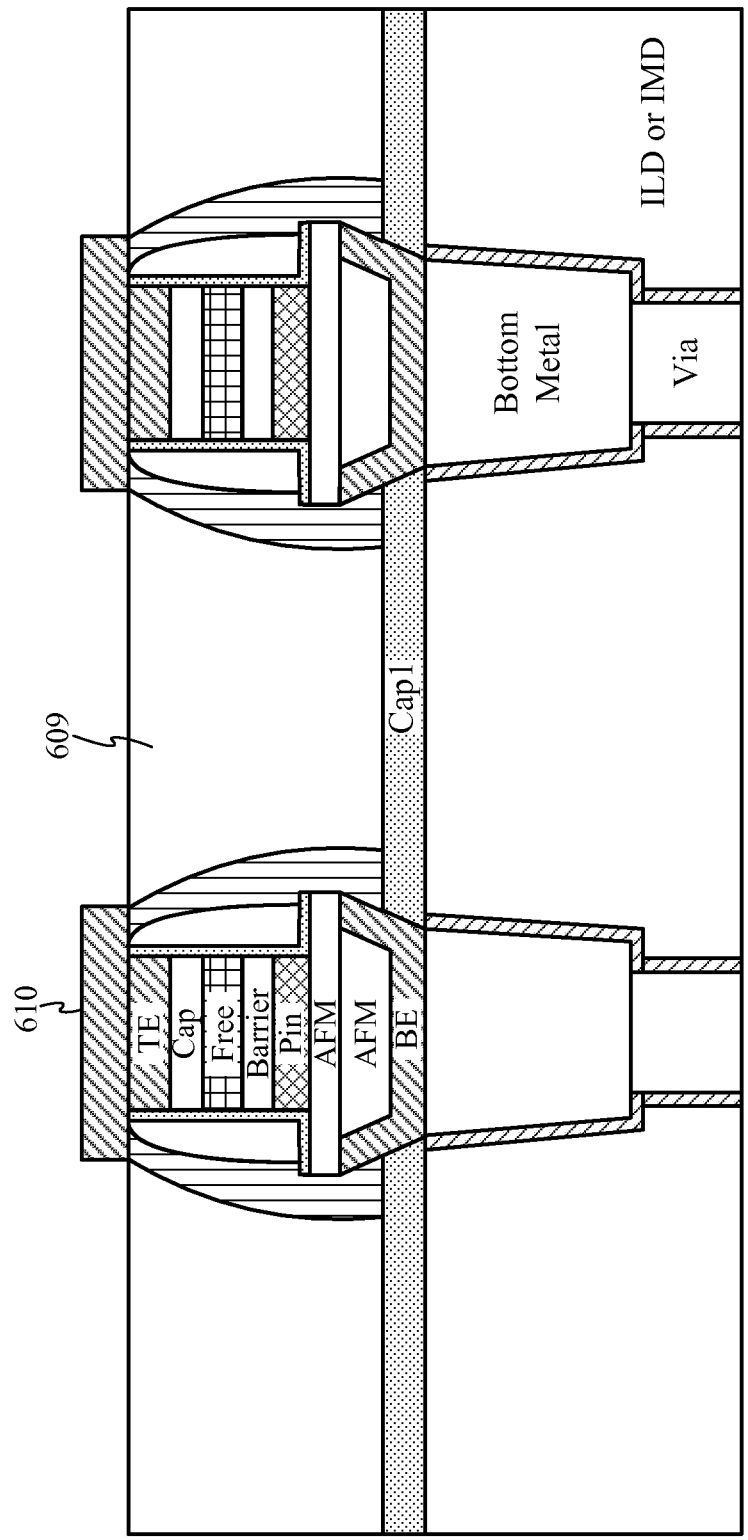
FIG. 6F is a cross-section of a magnetic tunnel junction device fabrication for a TEC patterning.

FIG. 6F illustrates the TEC patterning process at 325. A TEC 610 patterning is performed, which may stop on the IMD film 609. The TEC 610 mask may be shared with a reverse mask. The IMD film 609 gap may be made shallow, which facilitates the gap filling process 316. As a result, the process margin of the fabrication of the MTJ structure may be improved.

Figure 6G:
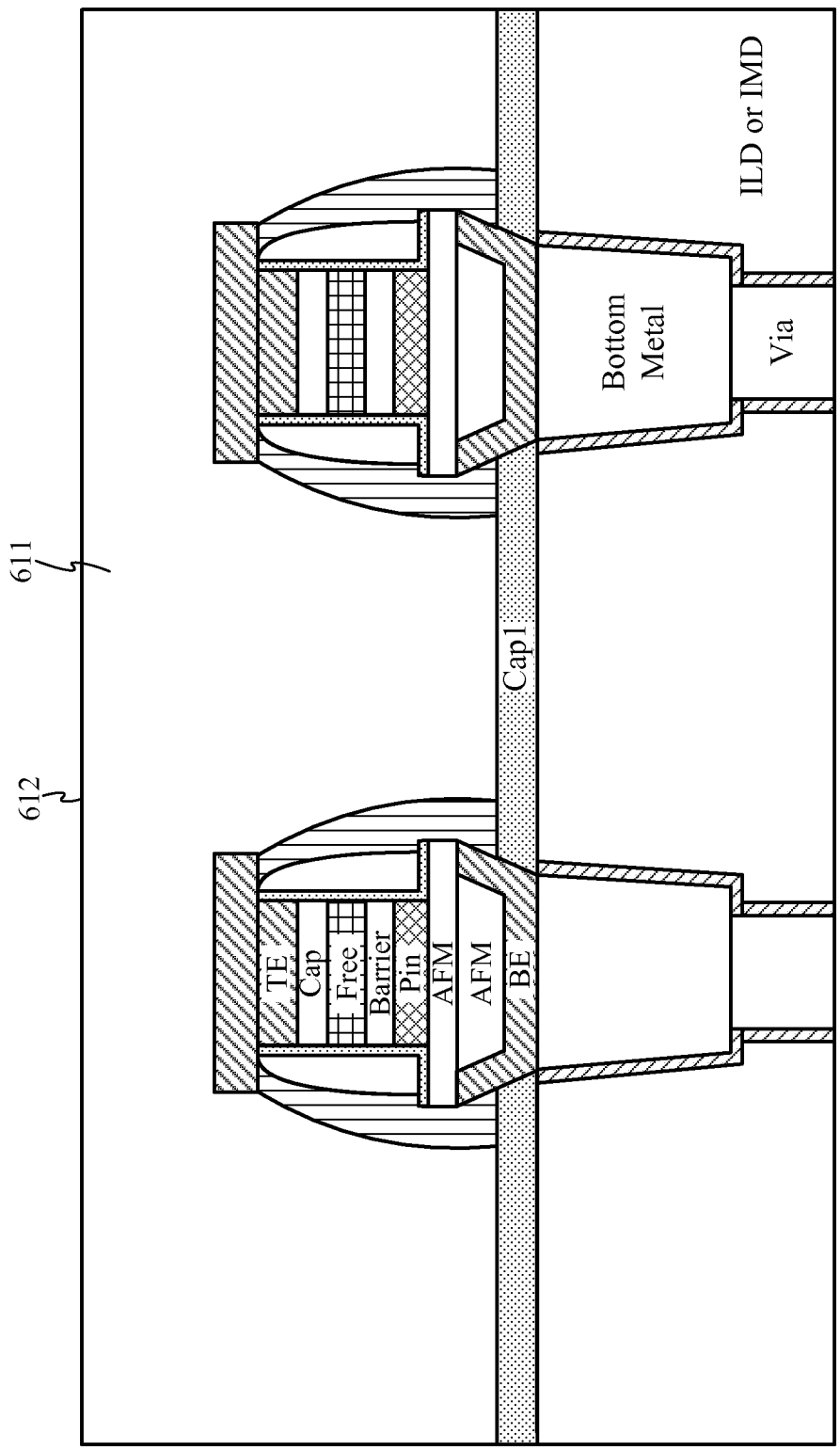
FIG. 6G is a cross-section of a magnetic tunnel junction device fabrication for an IMD film deposit and CMP.

FIG. 6G illustrates the IMD film deposit and CMP process at 326. The IMD film 611 is deposited to fill gaps. Then, a CMP process of the IMD film 611 is performed for planarization of the IMD surface 612.

Figure 6H:
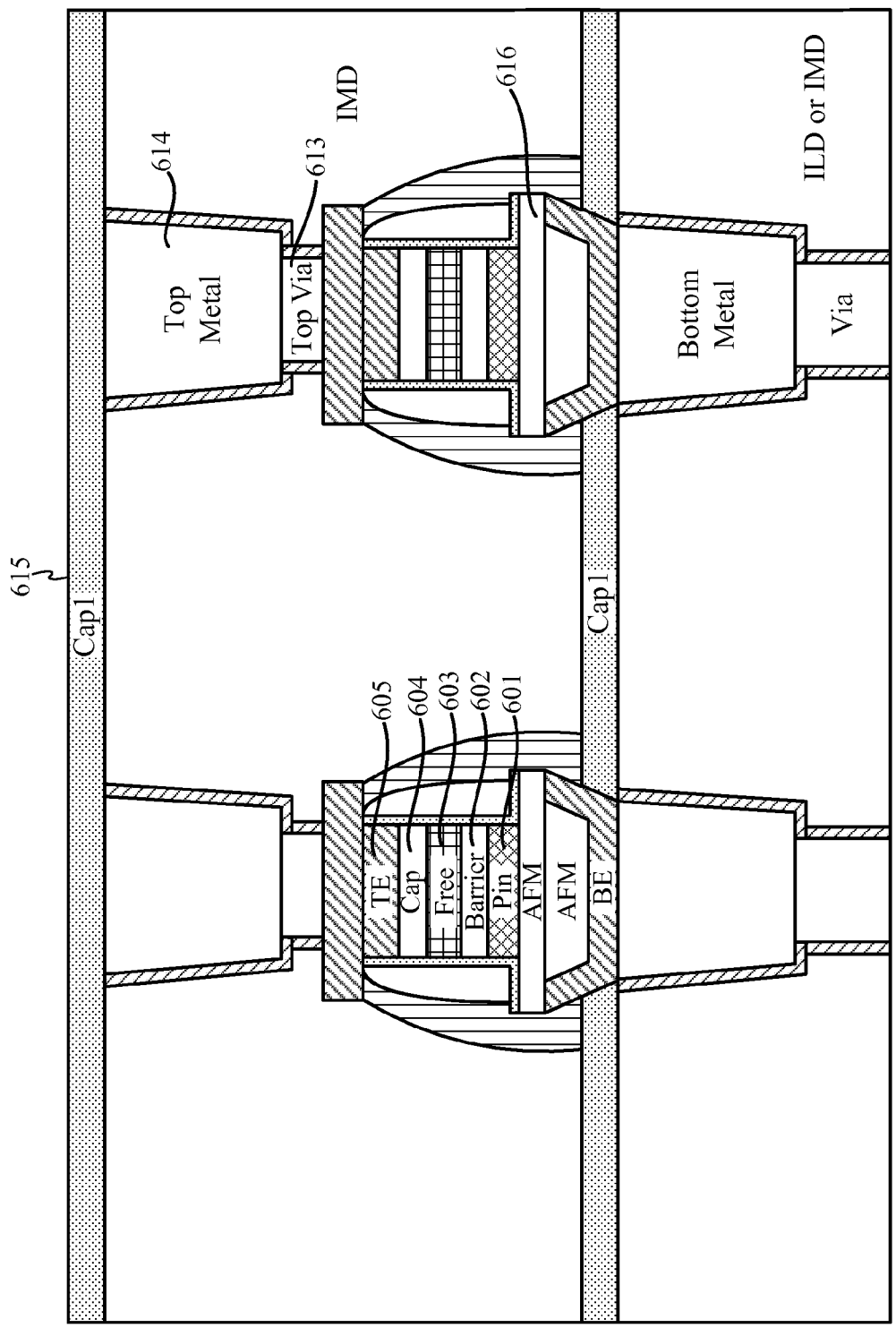
FIG. 6H is a cross-section of a magnetic tunnel junction device fabrication for forming a top via and top metal connection.

FIG. 6H illustrates the forming of the top via 613 and top metal connection 614 at 327. Process 327 may use trench and copper plating, as well as CMP for the top via 613 and top metal connection 614. The top via height 613 may be adjustable according to user preference. Another cap film layer 615 may also be deposited to protect the top metal connection 614.

Figure 7:
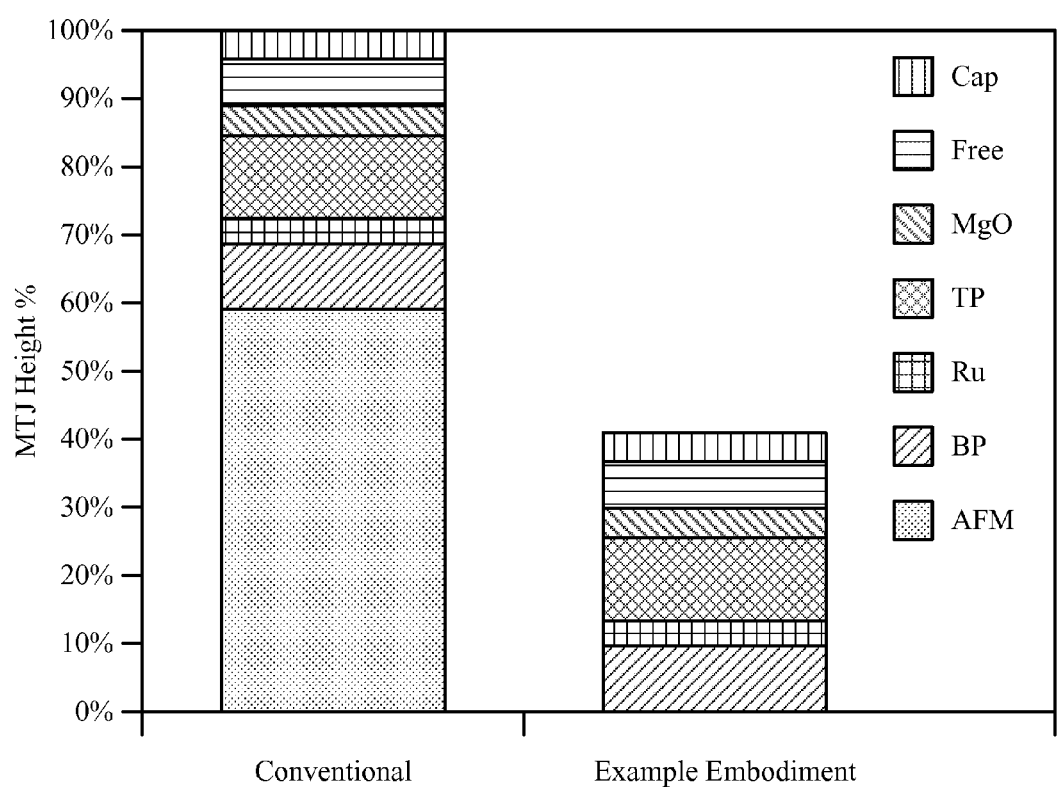
FIG. 7 is a chart comparing the height of a conventional MTJ versus the height of an MTJ formed according to an embodiment of the disclosure.

FIG. 7 illustrates how embodiments herein may reduce MTJ etch by up to 60% by removing the AFM layer from the MTJ stack. Reducing MTJ height may also reduce sidewall damage caused by MTJ etching. Additionally, a minimum width of the BE layer may be formed in a range of 0.5 to 10 times the minimum width of the MTJ stack.

In view of the above descriptions, it will also be appreciated how MTJ short circuits may be reduced by retaining sufficient MTJ top cap thickness. Additionally, by reducing MTJ etching, MTJ size and shape control may be improved, and thus, variation reduced.

Notably, as depicted in FIGS. 5C and 6C, for example, an oxidation film may be used for an oxide spacer 507, 607 as a hard mask and to remove the remaining pin layer 501, 601. Stress and strain films 508, 608 may also be used as a spacer to reduce MTJ switching current, as depicted in FIGS. 5D and 6D. It will be appreciated that switching efficiency increases as the critical dimension size of the MTJ decreases. This is due to the current required being inversely proportional to device physical size, since the current passing through the MTJ device should be larger than a critical switching current.

Further, as depicted in FIGS. 4E, 5H and 6H, for example, an AFM layer 616 and a second cap film 402 may also be used, in order to maintain compatibility with logic back end of line (BEOL) integration. Manufacturing process flow influences cost, with more mask processes contributing to increased overall manufacturing costs. When fabrication of conventional MRAM requires a number of mask processes dedicated solely to the fabrication of the MTJ structure, costs are further increased. By sharing masks, fabrication may be completed with just three masking processes, namely: (i) bottom contact/top metal; (ii) reverse mask/TE; and (iii) MTJ. Accordingly, the fabrication methods described herein improve the design and process flow for integrating MRAM fabrication in the semiconductor manufacturing process flow. Moreover, these fabrication methods may help to relax alignment stress of critical dimension features.

Still further, as depicted in FIGS. 4A-D, for example, an adjustable second cap film 402 thickness and size may be used to keep AFM layer 412 filling and reduce a CMP dishing effect. A partial MTJ etch process may also be used to enlarge an MTJ process window and reduce MTJ sidewall damage. A top electrode contact (TEC) patterning may also be used to reduce an IMD void and improve IMD gap filling performance. Embodiments herein may include less void due to a small aspect ratio (AR) and better IMD gap filling performance. In addition, an adjustable height top via and/or top metal connect may be utilized with the MTJ TEC.

Bottom electrode contact resistance and parasitic stress may also be reduced when the BE layer is sloped in relation to the planarized layer. That is, a sloped bottom contact may improve BE/AFM layer gap filling performance and release stress. An AFM/BE layer reverse etch and chemical mechanical polishing (CMP) or planarization may also be used to reduce surface roughness. For further reduction of surface roughness, a second AFM deposition and CMP may be performed. The second CMP may extend or almost extend to the first AFM CMP surface. A relatively large bottom contact and filling may also be provided to reduce parasitic resistance. An adjustable BE size may also help to reduce CMP dishing and improve uniformity.

An MTJ device as disclosed herein may also be utilized for MRAM fabrication to improve scalability to smaller dimensions. As a result, the compatibility with nano-scale fabrication enables lower cost and higher device density fabrication of MRAM memory chips with scaling. Accordingly, fabrication can be completed at lower cost and with improved yield. A significant determinant of a memory system's cost is the density of the components on the chip. Smaller components and/or fewer components per cell, results in more cells being packed onto a single chip, which in turn results in more chips being produced from a single semiconductor wafer.

The foregoing disclosed devices and methods are typically designed and are configured into GDSII and GERBER computer files, stored on a computer readable medium. These files are in turn provided to fabrication handlers who fabricate devices based on these files. The resulting products are semiconductor wafers that are then cut into semiconductor die and packaged into a semiconductor chip. The chips are then employed in devices such as those described above in relation to FIG. 1.

Figure 8:
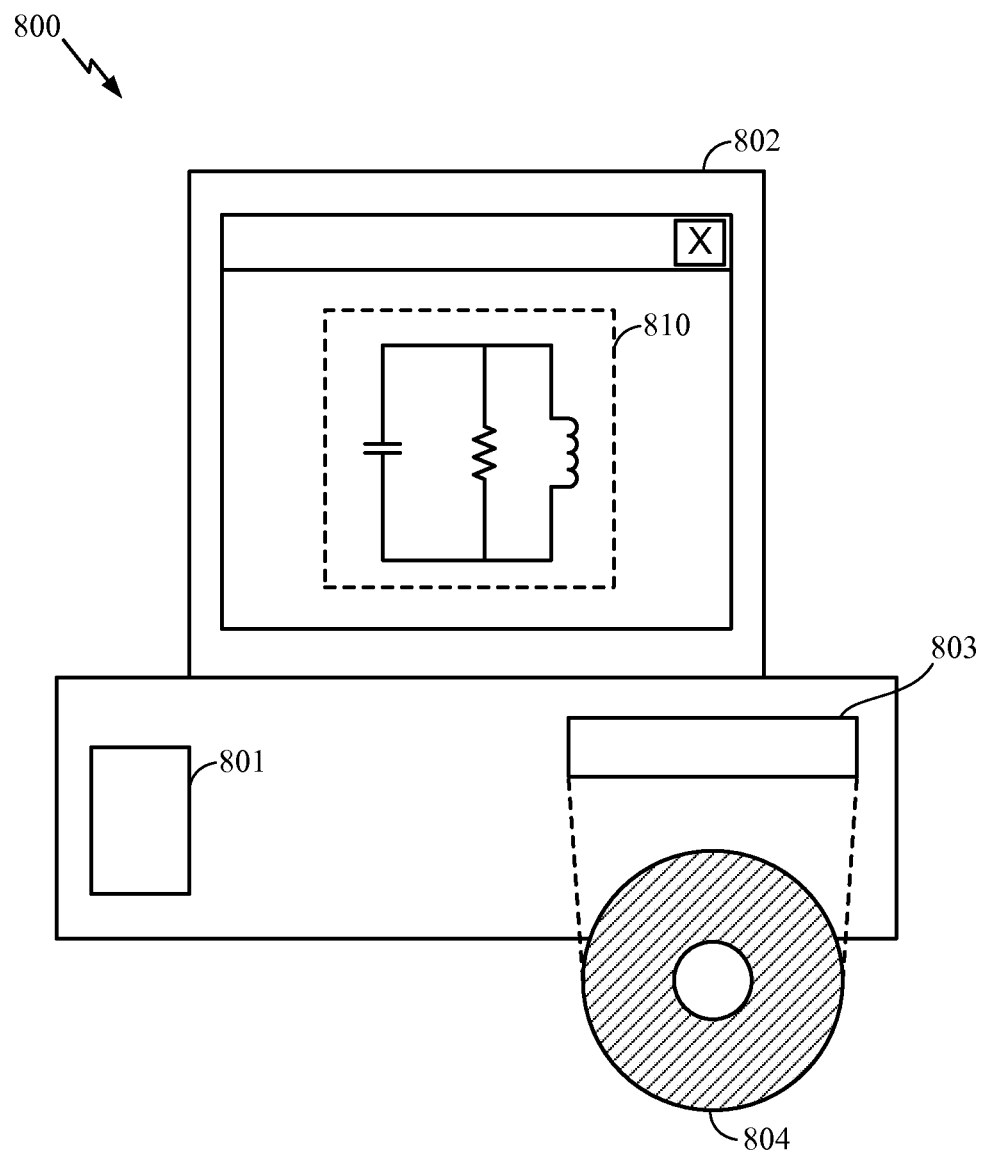
FIG. 8 is a block diagram illustrating a design workstation used for circuit, layout, logic design and integration of MRAM in a semiconductor process flow, in accordance with an embodiment of the disclosure.

FIG. 8 is a block diagram illustrating a design workstation 800 used for circuit, layout, and logic design of the disclosed semiconductor integrated circuits. A design workstation 800 includes a hard disk 801 containing operating system software, support files, and design software such as CADENCE or ORCAD. The design workstation 800 also includes a display 802 to facilitate design of a circuit design 810. The circuit design 810 may be one of the memory circuits disclosed above. A storage medium 804 is provided for tangibly storing the circuit design 810. The circuit design 810 may be stored on the storage medium 804 in a file format such as GDSII or GERBER. The storage medium 804 may be a CD-ROM, DVD, hard disk, flash memory, or other appropriate device. Furthermore, the design workstation 800 includes a drive apparatus 803 for accepting input from the storage medium 804 or writing output to the storage medium 804.

Data recorded on the storage medium 804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit design 810 by decreasing the number of processes for designing semiconductor ICs.

However, those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for fabrication of MTJ structure. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A memory device comprising:
    a magnetic tunnel junction (MTJ) stack including a free layer, a barrier layer, and a pinned layer;
    a bottom electrode (BE) layer coupled to the MTJ stack, encapsulated in a planarized layer, and having a substantially common axis with the MTJ stack; and
    a contact layer embedded in the BE layer, the contact layer forming an interface between the BE layer and the MTJ stack, wherein the contact layer is a first anti-ferromagnetic (AFM) layer; and wherein the MTJ stack further includes a second AFM layer coupling the MTJ stack to the first AFM layer.

2. The memory device of claim 1, wherein the planarized layer comprises a cap film layer.

3. The memory device of claim 1, wherein the MTJ stack directly contacts at least a portion of the BE layer.

4. The memory device of claim 1, wherein there is no direct contact between the MTJ stack and the BE layer.

5. The memory device of claim 1, wherein the BE layer engages the planarized layer at an edge that is sloped in relation to the planarized layer.

6. The memory device of claim 1, wherein a minimum width of the BE layer is in a range of about 0.5 to 10 times a minimum width of the MTJ stack.

7. The memory device of claim 1, wherein the BE layer and the contact layer are formed by a reverse etch process and a chemical mechanical polishing (CMP) process.

8. The memory device of claim 1, further comprising a stress and strain spacer surrounding the MTJ stack.

9. The memory device of claim 1 integrated in at least one semiconductor die.

10. The memory device of claim 1 integrated in at least one of a set top box, music player, video player, entertainment unit, navigation device, communications device, personal digital assistant (PDA), fixed location data unit, or a computer.

11. A memory device comprising:
    an MTJ stack including a free layer, a barrier layer, and a pinned layer;
    a BE layer coupled to the MTJ stack, encapsulated in a planarized layer, and having a substantially common axis with the MTJ stack; and
    contact means for coupling the BE layer to the MTJ stack, the contact means being embedded in the BE layer to form an interface between the BE layer and the MTJ stack, wherein the contact means includes a first AFM layer and wherein the MTJ stack further includes a second AFM layer coupling the MTJ stack to the first AFM layer of the contact means.

12. The memory device of claim 11, wherein the BE layer engages the planarized layer at an edge that is sloped in relation to the planarized layer.

* * * * *